(12) United States Patent
Broyde et al.

(10) Patent No.: US 10,116,057 B2
(45) Date of Patent: *Oct. 30, 2018

(54) METHOD AND APPARATUS FOR AUTOMATIC TUNING OF AN IMPEDANCE MATRIX, AND RADIO TRANSMITTER USING THIS APPARATUS

(71) Applicant: Samsung Electronics Co., Ltd., Suwon-si, Gyeonggi-do (KR)

(72) Inventors: Frédéric Broyde, Maule (FR); Evelyne Clavelier, Maule (FR)

(73) Assignee: Samsung Electronics Co., Ltd., Suwon-si (KR)

( * ) Notice: Subject to any disclaimer, the term of this patent is extended or adjusted under 35 U.S.C. 154(b) by 81 days.

This patent is subject to a terminal disclaimer.

(21) Appl. No.: 15/296,724

(22) Filed: Oct. 18, 2016

(65) Prior Publication Data

US 2017/0040704 A1 Feb. 9, 2017

Related U.S. Application Data

(63) Continuation of application No. PCT/IB2015/057131, filed on Sep. 16, 2015.

(30) Foreign Application Priority Data

Jun. 22, 2015 (FR) .................................. 15 01290

(51) Int. Cl.
*H01Q 13/10* (2006.01)
*H01Q 21/00* (2006.01)
(Continued)

(52) U.S. Cl.
CPC .......... *H01Q 13/103* (2013.01); *H01Q 21/00* (2013.01); *H03F 3/24* (2013.01); *H03H 7/40* (2013.01);
(Continued)

(58) Field of Classification Search
CPC ...... H01Q 13/103; H01Q 21/00; H01Q 13/10; H04B 1/0458; H04B 7/0413; H04B 2001/0408; H04B 1/04587
See application file for complete search history.

(56) References Cited

U.S. PATENT DOCUMENTS 2,523,791 A 9/1950 Vahle et al.
2,745,067 A 5/1956 True et al.
(Continued)

FOREIGN PATENT DOCUMENTS

FR 2996067 A1 3/2014
FR 3004604 A1 10/2014
(Continued)

OTHER PUBLICATIONS

Broyde et al, "Some Properties of Multiple-Antenna-Port and Multiple-User-Port Antenna Tuners", IEEE Trans. on Circuits and Systems—I: Regular Papers, vol. 62, No. 2, pp. 423-432, Feb. 2015.
(Continued)

*Primary Examiner* — Tho G Phan
(74) *Attorney, Agent, or Firm* — Jefferson IP Law, LLP

(57) ABSTRACT

The invention relates to a method and an apparatus for automatic tuning of an impedance matrix, for instance the impedance matrix seen by the power amplifiers of a radio transmitter using a plurality of antennas simultaneously. The apparatus has 4 user ports and 4 target ports, and comprises: 4 sensing units; a signal processing unit which estimates real quantities depending on the impedance matrix presented by the user ports, using the sensing unit output signals obtained for 4 excitations applied to the user ports, two or more of the excitations being applied simultaneously, the signal processing unit delivering a tuning instruction; a multiple-input-port and multiple-output-port tuning unit comprising adjustable impedance devices; and a tuning control unit receiving the tuning instruction and delivering tuning control signals to (Continued)

the multiple-input-port and multiple-output-port tuning unit, the reactance of the adjustable impedance devices being mainly determined by the tuning control signals.

21 Claims, 5 Drawing Sheets

(51) Int. Cl.
   *H03H 7/40* (2006.01)
   *H03F 3/24* (2006.01)
   *H04B 1/04* (2006.01)
   *H04B 7/0413* (2017.01)

(52) U.S. Cl.
   CPC .......... *H04B 1/0458* (2013.01); *H04B 7/0413* (2013.01); *H04B 2001/0408* (2013.01)

(56) References Cited

U.S. PATENT DOCUMENTS

| | | | | |
|---|---|---|---|---|
| 2,881,417 | A * | 4/1959 | Currey | H04H 60/43 |
| | | | | 341/105 |
| 3,443,231 | A | 5/1969 | Roza | |
| 3,821,790 | A * | 6/1974 | Perry | H04N 9/643 |
| | | | | 348/652 |
| 4,356,458 | A | 10/1982 | Armitage | |
| 4,493,112 | A | 1/1985 | Bruene | |
| 5,225,847 | A | 7/1993 | Roberts et al. | |
| 7,663,555 | B2 * | 2/2010 | Caimi | H01Q 1/243 |
| | | | | 343/702 |
| 8,072,285 | B2 | 12/2011 | Spears et al. | |
| 8,299,867 | B2 | 10/2012 | McKinzie | |
| 8,981,774 | B2 * | 3/2015 | Leussler | G01R 33/3628 |
| | | | | 324/307 |
| 9,077,317 | B2 * | 7/2015 | Broyde | H04B 1/0458 |
| 9,401,695 | B2 * | 7/2016 | Hirama | H03H 11/40 |
| 9,698,484 | B1 * | 7/2017 | Broyde | H01Q 9/0442 |
| 9,755,576 | B2 * | 9/2017 | Perreault | H03F 1/0205 |
| 2015/0078485 | A1 | 3/2015 | Broyde | |
| 2016/0112028 | A1 * | 4/2016 | Baier | H01L 23/495 |
| | | | | 343/861 |

FOREIGN PATENT DOCUMENTS

| | | |
|---|---|---|
| FR | 3018637 A1 | 9/2015 |
| FR | 3018973 A1 | 9/2015 |
| FR | 3021813 A1 | 12/2015 |
| WO | WO2008/030165 A1 | 3/2008 |
| WO | WO 2014/049475 A2 | 4/2014 |
| WO | WO 2014/170766 A1 | 10/2014 |
| WO | WO2015/136409 A1 | 9/2015 |
| WO | WO2015/140660 A1 | 9/2015 |
| WO | WO2015/181653 A1 | 12/2015 |

OTHER PUBLICATIONS

Broyde et al, "A New Multiple-Antenna-Port and Multiple-User-Port Antenna Tuner", proceedings of the 2015 IEEE Radio & Wireless Week, RWW 2015, Jan. 2015.

Broyde et al, "Two Multiple-Antenna-Port and Multiple-User-Port Antenna Tuners", proceedings of the 9th European Conference on Antenna and Propagation, EuCAP 2015, Apr. 2015.

Search report for International Application No. PCT/IB2015/057131.

Written opinion for International Application No. PCT/IB2015/057131.

\* cited by examiner

METHOD AND APPARATUS FOR AUTOMATIC TUNING OF AN IMPEDANCE MATRIX, AND RADIO TRANSMITTER USING THIS APPARATUS

CROSS REFERENCE TO RELATED APPLICATIONS

This is a Continuation application of PCT application No. PCT/IB2015/057131, filed 16 Sep. 2015, entitled "Method and apparatus for automatic tuning of an impedance matrix, and radio transmitter using this apparatus", which in turn claims priority to French patent application No. 15/01290 of 22 Jun. 2015, entitled "Procédé et appareil pour accord automatique d'une matrice impedance, et émetteur radio utilisant cet appareil", both of which are incorporated herein by reference.

FIELD OF THE INVENTION

The invention relates to a method and an apparatus for automatic tuning of an impedance matrix, for instance the impedance matrix seen by the power amplifiers of a radio transmitter using a plurality of antennas simultaneously. The invention also relates to a radio transmitter using this apparatus.

PRIOR ART

Tuning an impedance means obtaining that an impedance presented by an input port of a device approximates a wanted impedance, and simultaneously offering an ideally lossless, or nearly lossless, transfer of power from the input port to an output port of the device, in a context where the impedance seen by the output port may vary. Thus, if a signal generator presenting an impedance equal to the complex conjugate of the wanted impedance is connected to the input port, it will deliver a maximum power to the input port, and the output port will deliver a power near this maximum power. In the present patent application, a device for tuning an impedance is referred to as a "single-input-port and single-output-port tuning unit". Two examples of a single-input-port and single-output-port tuning unit are presented in the prior art section of the French patent application No. 12/02542 of 25 Sep. 2012, entitled "Appareil d'accord d'antenne pour un réseau d'antennes à accès multiple" and in the corresponding international application PCT/IB2013/058423 of 10 Sep. 2013, entitled "Antenna tuning apparatus for a multiport antenna array", where each of these examples is designated as an antenna tuning apparatus which could be used to tune a single antenna. A single-input-port and single-output-port tuning unit comprises one or more adjustable impedance devices each having an adjustable reactance. To tune the impedance, the reactances of the adjustable impedance devices must be adjusted as a function of the impedance seen by the output port.

Many methods and apparatuses for automatically tuning an impedance have been described, which use one or more real quantities depending on the impedance presented by the input port, these real quantities being processed to obtain "tuning control signals", the tuning control signals being used to control the reactances of the adjustable impedance devices of a single-input and single-output tuning unit.

For instance, in an apparatus for automatically tuning an impedance disclosed in the patent of the U.S. Pat. No. 2,523,791, entitled "Automatic Tuning System", in an apparatus for automatically tuning an impedance disclosed in the patent of the U.S. Pat. No. 2,745,067, entitled "Automatic Impedance Matching Apparatus", and in an apparatus for automatically tuning an impedance disclosed in the patent of the U.S. Pat. No. 3,443,231, entitled "Impedance Matching System", the wanted impedance is a resistance. We shall use $R_0$ to denote this resistance. In each of these apparatuses, a voltage v and a current i are sensed at a given point in a circuit, the impedance presented by the input port being $Z=v/i$. In each of these apparatuses, the real quantities depending on the impedance presented by the input port are a voltage determined by the phase of v relative to i, this phase being equal to the argument of Z, and a voltage substantially proportional to the difference $|v|-R_0|i|$. In each of these apparatuses, the second real quantity depending on the impedance presented by the input port is substantially equal to zero if the impedance presented by the input port is substantially equal to the wanted impedance, but the converse is not true. In the case of said U.S. Pat. No. 2,745,067 and U.S. Pat. No. 3,443,231, the two real quantities depending on the impedance presented by the input port are substantially equal to zero if and only if the impedance presented by the input port is substantially equal to the wanted impedance. In the case of said U.S. Pat. No. 3,443,231, two other real quantities representative of an impedance other than the impedance presented by the input port are also used to obtain the tuning control signals.

For instance, in an apparatus for automatically tuning an impedance disclosed in the patent of the U.S. Pat. No. 4,356,458, entitled "Automatic Impedance Matching Apparatus" and in an apparatus for automatically tuning an impedance disclosed in the patent of the U.S. Pat. No. 5,225,847 entitled "Automatic Antenna Tuning System", two voltages are sensed: a voltage substantially proportional to the absolute value of a complex incident voltage (an incident voltage is also referred to as forward voltage), and a voltage substantially proportional to the absolute value of a complex reflected voltage. Using the same notations as above, $v_F$ to denote the complex incident voltage, and $v_R$ to denote the complex reflected voltage, the specialist understands that said absolute values are given by $|v_F|=|v+R_0\,i|/2$ and by $|v_R|=|v-R_0\,i|/2$, respectively. In each of these apparatuses, a single real quantity depending on the impedance presented by the input port is used. It is a number processed in a digital circuit. In one of these apparatuses, this number is substantially equal to the ratio of the absolute value of the complex reflected voltage to the absolute value of the complex incident voltage, that is to say, to $|v_R|/|v_F|$. In the other of these apparatuses, this number is substantially equal to the squared inverse of this ratio, that is to say, to $|v_F|^2/|v_R|^2$.

For instance, in an apparatus for automatically tuning an impedance disclosed in the patent of the U.S. Pat. No. 4,493,112, entitled "Antenna Tuner Discriminator", two complex voltages are sensed: a voltage substantially proportional to an incident voltage, and a voltage substantially proportional to a reflected voltage. Using the incident voltage as reference for the phase, a voltage proportional to the real part of the reflected voltage and a voltage proportional to the imaginary part of the reflected voltage are obtained. In this apparatus, the real quantities depending on the impedance presented by the input port are the voltage proportional to the real part of the reflected voltage and the voltage proportional to the imaginary part of the reflected voltage. In this apparatus, the two real quantities depending on the impedance presented by the input port are substantially equal to zero if and only if the impedance presented by the input port is substantially equal to the wanted impedance.

In the apparatuses disclosed in said U.S. Pat. Nos. 4,356,458 and 5,225,847, a digital feedback loop involving sequential logic must be used to obtain the tuning control signals and tune the impedance presented by the input port, because the single real quantity depending on the impedance presented by the input port does not provide a full information on the impedance presented by the input port. In the other apparatuses considered above, a faster tuning can be obtained, because two real quantities depending on the impedance presented by the input port provide a full information on the impedance presented by the input port, so that a simple degenerative feedback loop can be used to obtain the tuning control signals and tune the impedance presented by the input port. However, an apparatus for automatically tuning an impedance using two real quantities depending on the impedance presented by the input port, providing a full information on the impedance presented by the input port, could achieve the fastest tuning if, based on this full information obtained at a given time, it computes the values of the tuning control signals needed to obtain an exact tuning and quickly delivers the corresponding tuning control signals.

When the input port is intended to be coupled to the radio-frequency signal port of a wireless receiver or of a wireless transmitter, an apparatus for automatically tuning an impedance is sometimes referred to as "automatic antenna tuner" or as "adaptive impedance matching module", for instance in the patent of the U.S. Pat. No. 8,072,285, entitled "Method for tuning an adaptive impedance matching network with a look-up table", or in the patent of the U.S. Pat. No. 8,299,867, entitled "Adaptive impedance matching module". An apparatus for automatically tuning an impedance is indeed adaptive, in the sense that some circuit parameters, namely the reactances of adjustable impedance devices, are varied with time as a function of circuit variables such as sensed voltages or currents.

Tuning an impedance matrix means obtaining that an impedance matrix presented by a plurality of input ports of a device approximates a wanted impedance matrix, and simultaneously offering an ideally lossless, or nearly lossless, transfer of power from the plurality of input ports to a plurality of output ports of the device, in a context where the impedance matrix seen by the plurality of output ports may vary. Thus, if the ports of a multiport signal generator presenting an impedance matrix equal to the hermitian adjoint (that is to say a matrix equal to the matrix transpose of the matrix complex conjugate) of the wanted impedance matrix are suitably connected to the plurality of input ports, said multiport signal generator delivers a maximum power to the plurality of input ports, and the plurality of output ports delivers a power near this maximum power. In the present patent application, a device for tuning an impedance matrix is referred to as a "multiple-input-port and multiple-output-port tuning unit". Examples of a multiple-input-port and multiple-output-port tuning unit are disclosed in said French patent application No. 12/02542 and said corresponding international application PCT/IB2013/058423, each of these examples being designated as an "antenna tuning apparatus for a multiport antenna array". A multiple-input-port and multiple-output-port tuning unit comprises several adjustable impedance devices each having an adjustable reactance. To tune the impedance matrix, the reactances of the adjustable impedance devices must be adjusted as a function of the impedance matrix seen by the plurality of output ports.

The specialist understands that a plurality of apparatuses for automatically tuning an impedance can be used to automatically tune an impedance matrix, in the special case where the interactions between the ports of a multiport load coupled to the output ports of the plurality of apparatuses are very small, and where the wanted impedance matrix is diagonal. This approach cannot be used for automatically tuning an impedance matrix, in the case where the interactions between the ports of a multiport load coupled to the output ports are not very small, that is to say in the case where the impedance matrix seen by the output ports is not substantially diagonal.

The French patent application No. 13/00878 of 15 Apr. 2013, entitled "Procédé et appareil pour accorder automatiquement une matrice impédance, et émetteur radio utilisant cet appareil", corresponding to the international application No. PCT/IB2014/058933 of 12 Feb. 2014 and to the patent of the U.S. Pat. No. 9,077,317, both entitled "Method and apparatus for automatically tuning an impedance matrix, and radio transmitter using this apparatus", discloses a method for automatically tuning an impedance matrix of size m by m, this method using m or more different excitations applied successively to the input ports. Unfortunately, this method is usually not compatible with the specification of a radio transmitter used for MIMO wireless communication, because the generation of a sequence of m or more different excitations entails an emission of electromagnetic waves, which is usually not compatible with the requirements of all MIMO emission modes of applicable standards, for instance the LTE-Advanced standards.

Consequently, there is no known solution to the problem of automatically tuning an impedance matrix seen by a radio transmitter used for MIMO wireless communication, in a manner that complies with standards typically applicable to MIMO wireless networks.

SUMMARY OF THE INVENTION

The purpose of the invention is a method and an apparatus for automatically tuning an impedance matrix, without the above-mentioned limitations of known techniques, and also a radio transmitter using this apparatus.

In what follows, "having an influence" and "having an effect" have the same meaning.

The method of the invention is a method for automatically tuning an impedance matrix presented, at a given frequency, by m ports of an apparatus, where m is an integer greater than or equal to 2, each of said m ports being referred to as "user port", the apparatus having said m user ports and n other ports, where n is an integer greater than or equal to 2, each of said n other ports being referred to as "target port", said impedance matrix being referred to as "the impedance matrix presented by the user ports" and denoted by $Z_U$, the apparatus allowing, at said given frequency, a transfer of power from the user ports to the target ports, the method comprising the steps of:

applying m excitations to the user ports, one and only one of the excitations being applied to each of the user ports, the m excitations being not applied successively;

estimating q real quantities depending on the impedance matrix presented by the user ports, where q is an integer greater than or equal to m, using said m excitations;

using said q real quantities depending on the impedance matrix presented by the user ports, to obtain "tuning control signals";

adjusting the impedance matrix presented by the user ports using a multiple-input-port and multiple-output-port tuning unit, the multiple-input-port and multiple-output-port tuning unit comprising p adjustable impedance devices, where p is an integer greater than or equal to m, the p adjustable impedance devices being referred to as "the adjustable impedance devices of the tuning unit" and being such that, at said given frequency, each of the adjustable impedance devices of the tuning unit has a reactance, the reactance of any one of the adjustable impedance devices of the tuning unit having an influence on the impedance matrix presented by the user ports, the reactance of any one of the adjustable impedance devices of the tuning unit being adjustable by electrical means; and applying each of the tuning control signals to one or more of the adjustable impedance devices of the tuning unit, the reactance of each of the adjustable impedance devices of the tuning unit being mainly determined by one or more of the tuning control signals.

According to the invention, the given frequency is for instance a frequency greater than or equal to 150 kHz. The specialist understands that the impedance matrix presented by the user ports is a complex matrix of size m by m. Said transfer of power from the user ports to the target ports may be a transfer of power with small or negligible or zero losses, this characteristic being preferred.

The m excitations are not applied successively, that is to say: the m excitations are not applied one after another. Thus, it is for instance possible that two or more of the excitations are applied simultaneously. Thus, it is for instance possible that the m excitations are applied simultaneously.

According to the invention, each of the excitations may for instance be a bandpass signal. This type of signal is also sometimes improperly referred to as "passband signal" or "narrow-band signal" (in French: "signal à bande étroite"). A bandpass signal is any real signal s(t), where t denotes the time, such that the spectrum of s(t) is included in a frequency interval $[f_C-W/2, f_C+W/2]$, where $f_C$ is a frequency referred to as "carrier frequency" and where W is a frequency referred to as "bandwidth", which satisfies $W<2 f_C$. Thus, the Fourier transform of s(t), denoted by S(f), is non-negligible only in the frequency intervals $[-f_C-W/2, -f_C+W/2]$ and $[f_C-W/2, f_C+W/2]$. The complex envelope of the real signal s(t), also referred to as "complex baseband equivalent" or "baseband-equivalent signal", is a complex signal $s_B(t)$ whose Fourier transform $S_B(f)$ is non-negligible only in the frequency interval $[-W/2, W/2]$ and satisfies $S_B(f)=k\ S(f_C+f)$ in this interval, where k is a real constant which is chosen equal to the square root of 2 by some authors. The real part of $s_B(t)$ is referred to as the in-phase component, and the imaginary part of $s_B(t)$ is referred to as the quadrature component. The specialist knows that the bandpass signal s(t) may for instance be obtained:

as the result of a phase and amplitude modulation of a single carrier at the frequency $f_C$;

as a linear combination of a first signal and a second signal, the first signal being the product of the in-phase component and a first sinusoidal carrier of frequency $f_C$, the second signal being the product of the quadrature component and a second sinusoidal carrier of frequency $f_C$, the second sinusoidal carrier being 90° out of phase with respect to the first sinusoidal carrier;

in other ways, for instance without using any carrier, for instance using directly a filtered output of a digital-to-analog converter.

The frequency interval $[f_C-W/2, f_C+W/2]$ is a passband of the bandpass signal. From the definitions, it is clear that, for a given bandpass signal, several choices of carrier frequency $f_C$ and of bandwidth W are possible, so that the passband of the bandpass signal is not uniquely defined. However, any passband of the bandpass signal must contain any frequency at which the spectrum of s(t) is not negligible.

According to the invention, each of the excitations could for instance be a bandpass signal, the bandpass signal having a passband which contains said given frequency. In this case, it would be possible to consider that said given frequency is a carrier frequency. Thus, in this case, each of the excitations could for instance be obtained:

as the result of a phase and amplitude modulation of a single carrier at said given frequency;

as a linear combination of a first signal and a second signal, the first signal being the product of the in-phase component and a first sinusoidal carrier at said given frequency, the second signal being the product of the quadrature component and a second sinusoidal carrier at said given frequency;

in other ways, for instance without using any carrier.

The complex envelope of the real signal s(t) clearly depends on the choice of a carrier frequency $f_C$. However, for a given carrier frequency, the complex envelope of the real signal s(t) is uniquely defined, for a given choice of the real constant k.

According to the invention, for a given choice of the real constant k, it is possible that, said given frequency being considered as a carrier frequency, each of the excitations has one and only one complex envelope, the m complex envelopes of the m excitations being linearly independent in the set of complex functions of one real variable, regarded as a vector space over the field of complex numbers. It was found that this characteristic can be used in such a way that the effects of each of the excitations can be identified with suitable signal processing, as if the excitations had been applied successively to the user ports, so that, as explained below in the presentation of the first embodiment, said m excitations can be used to estimate the q real quantities depending on the impedance matrix presented by the user ports. The specialist understands that this characteristic of the method of the invention cannot be obtained with a plurality of apparatuses for automatically tuning an impedance, used to tune an impedance matrix, as presented above in the prior art section. The specialist also understands that this characteristic of the method of the invention avoids the interferences which wreak havoc on the operation of a plurality of apparatuses for automatically tuning an impedance, used to tune an impedance matrix, in the case where the interactions between the ports of a multiport load coupled to their output ports are not very small. Moreover, as discussed below in the presentations of the first and third embodiments, this characteristic is compatible with the requirements of typical specifications of radio transmitters used for MIMO wireless communication, because the generation of excitations having this characteristic is compatible with the requirements of standards typically applicable to MIMO wireless networks. For instance, this characteristic is compatible with all MIMO emission modes of the LTE-Advanced standards. Consequently, the invention overcomes the above-mentioned limitations of prior art.

According to the invention, for a given choice of the real constant k, it is possible that, said given frequency being considered as a carrier frequency, each of the excitations has one and only one complex envelope, the m complex envelopes being orthogonal to one another for a given scalar product ("scalar product" is also referred to as "inner product"). The advantage of this characteristic will be explained below in the presentation of the second embodiment.

According to the invention, each of said q real quantities depending on the impedance matrix presented by the user ports may for instance be a real quantity representative of the impedance matrix presented by the user ports.

According to the invention, each of said q real quantities depending on the impedance matrix presented by the user ports may for instance be substantially proportional to the absolute value, or the phase, or the real part, or the imaginary part of an entry of the impedance matrix presented by the user ports, or of an entry of the inverse of the impedance matrix presented by the user ports (that is, the admittance matrix presented by the user ports), or of an entry of a matrix of the voltage reflection coefficients at the user ports, defined as being equal to $(Z_U-Z_O)(Z_U+Z_O)^{-1}$, where $Z_O$ is a reference impedance matrix.

The specialist understands that the tuning control signals determine the reactances of the adjustable impedance devices of the tuning unit, so that they have an influence on the impedance matrix presented by the user ports. According to the invention, it is possible that the tuning control signals are such that the impedance matrix presented by the user ports decreases or minimizes a norm of the image of the impedance matrix presented by the user ports under a matrix function, the matrix function being a function from a set of square complex matrices into the same set of square complex matrices. For instance, this norm may be a vector norm or a matrix norm. For instance, if we define a wanted impedance matrix, the wanted impedance matrix being denoted by $Z_W$, said matrix function may be defined by $$f(Z_U)=Z_U-Z_W \quad (1)$$

in which case the image of $Z_U$ under the matrix function is a difference of impedance matrices, or by $$F(Z_U)=Z_U^{-1}-Z_W^{-1} \quad (2)$$

in which case the image of $Z_U$ under the matrix function is a difference of admittance matrices, or by $$f(Z_U)=(Z_U-Z_W)(Z_U+Z_W)^{-1} \quad (3)$$

in which case the image of $Z_U$ under the matrix function is a matrix of the voltage reflection coefficients at the user ports. We note that each of these matrix functions is such that $f(Z_W)$ is a null matrix, so that the norm of $f(Z_W)$ is zero.

An adjustable impedance device is a component comprising two terminals which substantially behave as the terminals of a passive linear two-terminal circuit element, and which are consequently fully characterized by an impedance which may depend on frequency, this impedance being adjustable. An adjustable impedance device may be adjustable by mechanical means, for instance a variable resistor, a variable capacitor, a network comprising a plurality of capacitors and one or more switches or change-over switches used to cause different capacitors of the network to contribute to the reactance, a variable inductor, a network comprising a plurality of inductors and one or more switches or change-over switches used to cause different inductors of the network to contribute to the reactance, or a network comprising a plurality of open-circuited or short-circuited stubs and one or more switches or change-over switches used to cause different stubs of the network to contribute to the reactance. We note that all examples in this list, except the variable resistor, are intended to provide an adjustable reactance.

An adjustable impedance device having a reactance which is adjustable by electrical means may be such that it only provides, at said given frequency, a finite set of reactance values, this characteristic being for instance obtained if the adjustable impedance device is:

a network comprising a plurality of capacitors or open-circuited stubs and one or more electrically controlled switches or change-over switches, such as electromechanical relays, or microelectromechanical switches (MEMS switches), or PIN diodes or insulated-gate field-effect transistors (MOSFETs), used to cause different capacitors or open-circuited stubs of the network to contribute to the reactance; or a network comprising a plurality of coils or short-circuited stubs and one or more electrically controlled switches or change-over switches used to cause different coils or short-circuited stubs of the network to contribute to the reactance.

An adjustable impedance device having a reactance which is adjustable by electrical means may be such that it provides, at said given frequency, a continuous set of reactance values, this characteristic being for instance obtained if the adjustable impedance device is based on the use of a variable capacitance diode; or a MOS varactor; or a microelectromechanical varactor (MEMS varactor); or a ferroelectric varactor.

The method of the invention may be such that any diagonal entry of the impedance matrix presented by the user ports is influenced by the reactance of at least one of the adjustable impedance devices of the tuning unit. The method of the invention may be such that the reactance of at least one of the adjustable impedance devices of the tuning unit has an influence on at least one non-diagonal entry of the impedance matrix presented by the user ports. The specialist understands that this characteristic avoids the limited tuning capability of a plurality of apparatuses for automatically tuning an impedance, used to tune the impedance matrix of a plurality of ports, mentioned above in the prior art section. This question will be explored further in the discussion of the first and fourth embodiments.

An apparatus implementing the method of the invention is an apparatus for automatically tuning an impedance matrix presented, at a given frequency, by m ports of the apparatus, where m is an integer greater than or equal to 2, each of said m ports being referred to as "user port", the apparatus having said m user ports and n other ports, where n is an integer greater than or equal to 2, each of said n other ports being referred to as "target port", said impedance matrix being referred to as "the impedance matrix presented by the user ports" and denoted by $Z_U$, the apparatus allowing, at said given frequency, a transfer of power from the user ports to the target ports, the apparatus comprising:

at least m sensing units, each of the sensing units delivering one or more "sensing unit output signals", each of the sensing unit output signals being mainly determined by one or more electrical variables;

a signal processing unit, the signal processing unit estimating q real quantities depending on the impedance matrix presented by the user ports, where q is an integer greater than or equal to m, using the sensing unit output signals obtained form excitations applied to the user ports, one and only one of the excitations being applied to each of the user ports, the m excitations being not applied successively, the signal processing unit delivering a "tuning instruction" as a function of said q real quantities depending on the impedance matrix presented by the user ports;

a multiple-input-port and multiple-output-port tuning unit, the multiple-input-port and multiple-output-port tuning unit comprising p adjustable impedance devices, where p is an integer greater than or equal to m, the p adjustable impedance devices being referred to as "the adjustable impedance devices of the tuning unit" and being such that, at said given frequency, each of the adjustable impedance devices of the tuning unit has a reactance, the reactance of any one of the adjustable impedance devices of the tuning unit having an influence on the impedance matrix presented by the user ports, the reactance of any one of the adjustable impedance devices of the tuning unit being adjustable by electrical means; and a tuning control unit, the tuning control unit receiving the tuning instruction from the signal processing unit, the tuning control unit delivering "tuning control signals" to the multiple-input-port and multiple-output-port tuning unit, the tuning control signals being determined as a function of the tuning instruction, the reactance of each of the adjustable impedance devices of the tuning unit being mainly determined by one or more of the tuning control signals.

The m excitations are not applied successively, that is to say: the m excitations are not applied one after the other. Thus, it is for instance possible that two or more of the excitations are applied simultaneously.

It is for instance possible that each of the excitations is a bandpass signal. It is for instance possible that each of these bandpass signals has a passband which contains said given frequency.

For instance, each of said electrical variables may be a voltage, or an incident voltage, or a reflected voltage, or a current, or an incident current, or a reflected current. For instance, each of said electrical variables may be sensed at one of said user ports, or at one of said target ports, or at a port of the multiple-input-port and multiple-output-port tuning unit, or inside the multiple-input-port and multiple-output-port tuning unit.

Said multiple-input-port and multiple-output-port tuning unit comprises m input ports and n output ports. It is assumed that said multiple-input-port and multiple-output-port tuning unit behaves, at said given frequency, with respect to its input ports and output ports, substantially as a passive linear device, where "passive" is used in the meaning of circuit theory. More precisely, said multiple-input-port and multiple-output-port tuning unit behaves, at said given frequency, with respect to the n output ports and the m input ports, substantially as a passive linear (n+m)-port device. As a consequence of linearity, it is possible to define the impedance matrix presented by the input ports. As a consequence of passivity, the multiple-input-port and multiple-output-port tuning unit does not provide amplification.

It is possible that each of the m input ports of the multiple-input-port and multiple-output-port tuning unit is coupled, directly or indirectly, to one and only one of them user ports, and that each of the m user ports is coupled, directly or indirectly, to one and only one of the m input ports of the multiple-input-port and multiple-output-port tuning unit. It is possible that each of the n output ports of the multiple-input-port and multiple-output-port tuning unit is coupled, directly or indirectly, to one and only one of the n target ports, and that each of the n target ports is coupled, directly or indirectly, to one and only one of the n output ports of the multiple-input-port and multiple-output-port tuning unit. Thus, said transfer of power from the user ports to the target ports may take place through the multiple-input-port and multiple-output-port tuning unit. The integer p may be greater than or equal to 2m.

The specialist understands that: the tuning of the impedance matrix presented by the user ports is mainly determined by the tuning control signals, each of the tuning control signals being determined as a function of said real quantities depending on the impedance matrix presented by the user ports; and that the apparatus of the invention is adaptive in the sense that circuit parameters, namely the reactances of the adjustable impedance devices of the tuning unit, are varied with time as a function of the sensing unit output signals, which are each mainly determined by one or more electrical variables.

The specialist understands that the tuning instruction may for instance be determined as being a tuning instruction which, among a set of possible tuning instructions, produces an impedance matrix presented by the user ports which decreases or minimizes a norm of the image of the impedance matrix presented by the user ports under a matrix function, the matrix function being for instance one of the matrix functions $f$ such that $f(Z_U)$ is given by the equation (1) or the equation (2) or the equation (3). The specialist also understands that the tuning instruction may for instance be determined as being a tuning instruction which provides an impedance matrix presented by the user ports which is substantially equal to the wanted impedance matrix, for instance a tuning instruction such that $Z_U = Z_W$.

The invention is also about a transmitter for radio communication using the apparatus for automatically tuning an impedance matrix. A transmitter for radio communication of the invention is a transmitter for radio communication with a plurality of antennas in a given frequency band, comprising:

n antenna output ports, where n is an integer greater than or equal to 2;

m power amplifiers, where m is an integer greater than or equal to 2, each of the power amplifiers having an output port, each of the power amplifiers being able to deliver a power in said given frequency band, a part of said power being transferred to the antenna output ports, the output ports of the power amplifiers seeing, at a frequency in said given frequency band, an impedance matrix referred to as "the impedance matrix seen by the output ports of the power amplifiers", the impedance matrix seen by the output ports of the power amplifiers being a complex matrix of size m by m;

at least m sensing units, each of the sensing units delivering one or more "sensing unit output signals", each of the sensing unit output signals being mainly determined by one or more electrical variables;

a signal processing unit, the signal processing unit estimating q real quantities depending on the impedance matrix seen by the output ports of the power amplifiers, where q is an integer greater than or equal to m, using the sensing unit output signals obtained for m excitations applied by the power amplifiers at the output ports of the power amplifiers, one and only one of the excitations being applied at each of the output ports of the power amplifiers, the m excitations being not applied successively, the signal processing unit delivering a "tuning instruction" as a function of said q real quantities depending on the impedance matrix seen by the output ports of the power amplifiers;

a multiple-input-port and multiple-output-port tuning unit comprising p adjustable impedance devices, where p is an integer greater than or equal to m, the p adjustable impedance devices being referred to as "the adjustable impedance devices of the tuning unit" and being such that, at said frequency in said given frequency band, each of the adjustable impedance devices of the tuning unit has a reactance, the reactance of any one of the adjustable impedance devices of the tuning unit having an influence on the impedance matrix seen by the output ports of the power amplifiers, the reactance of any one of the adjustable impedance devices of the tuning unit being adjustable by electrical means; and a tuning control unit, the tuning control unit receiving the tuning instruction from the signal processing unit, the tuning control unit delivering "tuning control signals" to the multiple-input-port and multiple-output-port tuning unit, the tuning control signals being determined as a function of the tuning instruction, the reactance of each of the adjustable impedance devices of the tuning unit being mainly determined by one or more of the tuning control signals.

Said multiple-input-port and multiple-output-port tuning unit of the transmitter for radio communication of the invention comprises m input ports and n output ports. It is possible that each of the m input ports of the multiple-input-port and multiple-output-port tuning unit is coupled, directly or indirectly, to one and only one of said output ports of the power amplifiers, and that each of said output ports of the power amplifiers is coupled, directly or indirectly, to one and only one of the m input ports of the multiple-input-port and multiple-output-port tuning unit. It is possible that each of the n output ports of the multiple-input-port and multiple-output-port tuning unit is coupled, directly or indirectly, to one and only one of the n antenna output ports, and that each of the n antenna output ports is coupled, directly or indirectly, to one and only one of the n output ports of the multiple-input-port and multiple-output-port tuning unit. Thus, a part of said power delivered by the power amplifiers can be transferred to the antenna output ports. Said part of said power may be substantially equal to said power, this characteristic being preferred.

BRIEF DESCRIPTION OF THE DRAWINGS

Other advantages and characteristics will appear more clearly from the following description of particular embodiments of the invention, given by way of non-limiting examples, with reference to the accompanying drawings in which.

DETAILED DESCRIPTION OF SOME EMBODIMENTS

First Embodiment

Figure 1:
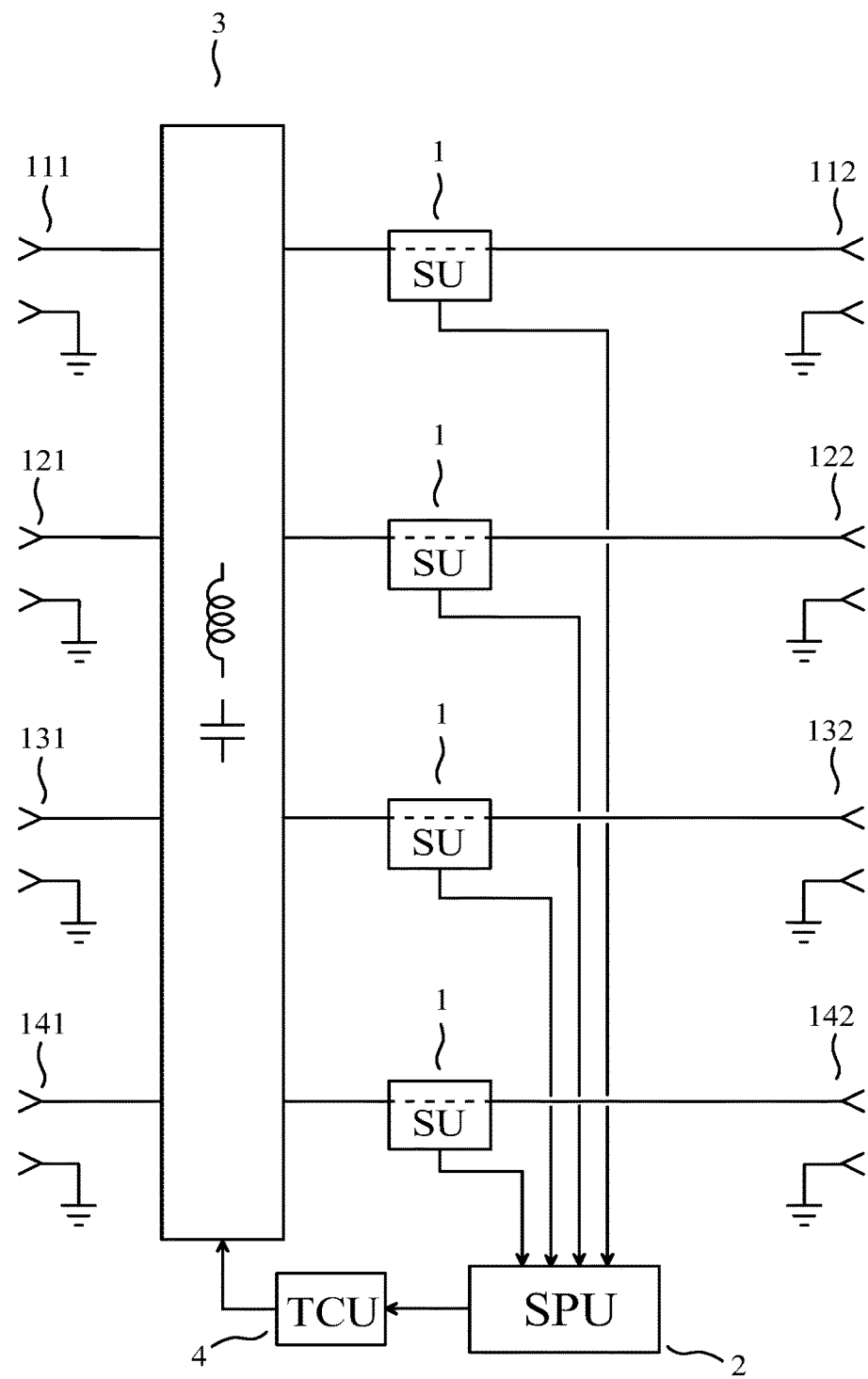
FIG. 1 shows the block diagram of an apparatus for automatically tuning an impedance matrix presented by 4 user ports (first embodiment)

As a first embodiment of a device of the invention, given by way of non-limiting example, we have represented in FIG. 1 the block diagram of an apparatus for automatically tuning an impedance matrix presented by m=4 user ports, at a given frequency greater than or equal to 30 MHz, the apparatus having said m user ports (112) (122) (132) (142) and n=4 target ports (111) (121) (131) (141), the impedance matrix being referred to as "the impedance matrix presented by the user ports" and denoted by $Z_U$, the apparatus comprising:

m sensing units (1), each of the sensing units delivering two "sensing unit output signals", each of the sensing unit output signals being determined by one electrical variable;

a signal processing unit (2), the signal processing unit estimating q real quantities depending on the impedance matrix presented by the user ports, where q is an integer greater than or equal to m, using the sensing unit output signals obtained for m excitations applied to the user ports, one and only one of the excitations being applied to each of the user ports, each of the excitations being a bandpass signal, the signal processing unit delivering a "tuning instruction" as a function of said q real quantities depending on the impedance matrix presented by the user ports;

a multiple-input-port and multiple-output-port tuning unit (3), the multiple-input-port and multiple-output-port tuning unit comprising p adjustable impedance devices, where p is an integer greater than or equal to 2m=8, the p adjustable impedance devices being referred to as "the adjustable impedance devices of the tuning unit" and being such that, at said given frequency, each of the adjustable impedance devices of the tuning unit has a reactance, the reactance of any one of the adjustable impedance devices of the tuning unit being adjustable by electrical means; and a tuning control unit (4), the tuning control unit receiving the tuning instruction from the signal processing unit (2), the tuning control unit delivering "tuning control signals" to the multiple-input-port and multiple-output-port tuning unit (3), the tuning control signals being determined as a function of the tuning instruction, the reactance of each of the adjustable impedance devices of the tuning unit being determined by one or more of the tuning control signals.

Each of the sensing units (1) may for instance be such that the two sensing unit output signals delivered by said each of the sensing units comprise: a first sensing unit output signal proportional to a first electrical variable, the first electrical variable being a voltage across one of the user ports; and a second sensing unit output signal proportional to a second electrical variable, the second electrical variable being a current flowing in said one of the user ports. Said voltage across one of the user ports may be a complex voltage and said current flowing in said one of the user ports may be a complex current. Alternatively, each of the sensing units (1) may for instance be such that the two sensing unit output signals delivered by said each of the sensing units comprise: a first sensing unit output signal proportional to a first electrical variable, the first electrical variable being an incident voltage (which may also be referred to as "forward voltage") at one of the user ports; and a second sensing unit output signal proportional to a second electrical variable, the second electrical variable being a reflected voltage at said one of the user ports. Said incident voltage at one of the user ports may be a complex incident voltage and said reflected voltage at said one of the user ports may be a complex reflected voltage.

Each of the electrical variables is substantially zero if no excitation is applied to any one of the user ports and if no excitation is applied to any one of the target ports.

An external device has m output ports, each of the output ports of the external device being coupled to one and only one of the user ports, each of the user ports being coupled to one and only one of the output ports of the external device. The external device is not shown in FIG. 1. The external device applies m excitations to the user ports, and informs the signal processing unit (2) of this action. One and only one of said m excitations is applied to each of the user ports, two or more of the excitations being applied simultaneously. Each of said m excitations is a bandpass signal having a passband which contains said given frequency. Said given frequency being considered as a carrier frequency, each of the excitations has one and only one complex envelope (or complex baseband equivalent), the m complex envelopes being linearly independent in E, where E is the set of complex functions of one real variable, regarded as a vector space over the field of complex numbers.

Let us number the user ports from 1 to m, and let us number the excitations from 1 to m, in such a way that, if a is an integer greater than or equal to 1 and less than or equal to m, the excitation number a is applied to the user port number a. For instance, if we use t to denote time, the excitations may be such that, for any integer a greater than or equal to 1 and less than or equal to m, the excitation number a consists of a current $i_a$ (t), of complex envelope $i_{E\,a}$ (t), applied to the user port number a, the complex envelopes $i_{E\,1}$ (t), ..., $i_{E\,m}$ (t) being linearly independent in E. Let us use $i_E$ (t) to denote the column vector of the complex envelopes $i_{E\,1}$ (t), ..., $i_{E\,m}$(t). Let us use $u_a$(t) to denote the voltage across the user port number a, and $u_{E\,a}$(t) to denote the complex envelope of $u_a$ (t). Let us use $u_E$ (t) to denote the column vector of the complex envelopes $u_{E\,1}$ (t), ..., $u_{E\,m}$(t). It is possible to show that, if the bandwidth of the complex envelopes $i_{E\,1}$ (t), ..., $i_{E\,m}$(t) is sufficiently narrow, we have $$u_E(t) = Z_U i_E(t) \quad (4)$$

If we consider the equation (4) for a fixed value of t, then the entries of $u_E$ (t) and $i_E$(t) are complex numbers. In this context, for m≥2 it is not possible to solve the equation (4) to derive $Z_U$ based on the knowledge of $u_E$ (t) and $i_E$(t) for a fixed value of t. In contrast, if we consider the equation (4) where t is a variable, then the entries of $i_E$(t) are linearly independent vectors of E. Thus, if we use S to denote the span of $i_{E\,1}$ (t), ..., $i_{E\,m}$(t) in E, we find that $i_{E\,1}$ (t), ..., $i_{E\,m}$(t) is a basis of S. In this context, the equation (4) teaches that each entry of $u_E$(t) lies in S, and that, for any integer a greater than or equal to 1 and less than or equal to m, the coordinates of the vector $u_{E\,a}$ (t) in the basis $i_{E\,1}$ (t), ..., $i_{E\,m}$ (t) are the entries of the row a of $Z_U$. Since these coordinates are unique, the equation (4) can be used to derive $Z_U$ based on the knowledge of $u_E$ (t) and $i_E$ (t), where t is a variable. Thus, the effects of the different excitations can be identified with suitable signal processing, as if the different excitations had been applied successively to the user ports, so that the m excitations can be used to estimate the impedance matrix presented by the user ports, and any real quantity depending on the impedance matrix presented by the user ports. Thus, m excitations which are not applied successively can be used in the invention, whereas they cannot be used in the method disclosed in said French patent application No. 13/00878, said international application No. PCT/IB2014/058933 and said patent of the U.S. Pat. No. 9,077,317.

We have just considered, as an example, the case in which the excitations are such that, for any integer a greater than or equal to 1 and less than or equal to m, the excitation number a consists of a current $i_a$ (t), of complex envelope $i_{E\,a}$(t), applied to the user port number a, the complex envelopes $i_{E\,1}$ (t), ..., $i_{E\,m}$ (t) being linearly independent in E. Alternatively, the excitations could for instance be such that, for any integer a greater than or equal to 1 and less than or equal to m, the excitation number a consists of a voltage $u_a$ (t), of complex envelope $u_{E\,a}$(t), applied to the user port number a, the complex envelopes $u_{E\,1}$ (t), ..., $u_{E\,m}$ (t) being linearly independent in E. In this case, using a proof similar to the one presented above for applied currents, we can show that the effects of the different excitations can be identified with suitable signal processing, as if the different excitations had been applied successively to the user ports, so that the m excitations can be used to estimate the impedance matrix presented by the user ports, and any real quantity depending on the impedance matrix presented by the user ports.

We observe that, in standards typically applicable to MIMO wireless networks, signals having complex envelopes which are linearly independent in E are used as reference signals (also referred to as pilot signals) for MIMO channel estimation. We see that these signals used as reference signals, if they are applied to the user ports, can be used as excitations having complex envelopes which are linearly independent in E. Consequently, this first embodiment is compatible with the requirements of standards typically applicable to MIMO wireless networks. This question is further discussed below, in the third embodiment.

The specialist understands how the signal processing unit (2) can use the sensing unit output signals obtained for them excitations applied to the user ports, them excitations being bandpass signals having complex envelopes which are linearly independent in E, to estimate q real quantities depending on the impedance matrix presented by the user ports. In this first embodiment, q=2 m² and the q real quantities depending on the impedance matrix presented by the user ports fully determine the impedance matrix presented by the user ports. For instance, let us consider the case where the two sensing unit output signals of any one of said sensing units are proportional to a complex voltage across one of the user ports and to a complex current flowing in said one of the user ports, respectively, and where the excitation number a consists of a current applied to the user port number a, as explained above. Based on the explanations about the equation (4), the specialist understands that all entries of $Z_U$ can be determined once the m excitations have been applied. For instance, said q real quantities depending on the impedance matrix presented by the user ports may consist of m² real numbers each proportional to the real part of an entry of $Z_U$ and of m² real numbers each proportional to the imaginary part of an entry of $Z_U$. For instance, said q real quantities depending on the impedance matrix presented by the user ports may consist of m² real numbers each proportional to the absolute value of an entry of $Z_U$ and of m² real numbers each proportional to the argument of an entry of $Z_U$.

For instance, if the sensing units (1) are numbered from 1 to m, we may consider the special case in which, for any integer a greater than or equal to 1 and less than or equal to m, the sensing unit number a delivers: a first sensing unit output signal proportional to the voltage $u_a(t)$ across the user port number a; and a second sensing unit output signal proportional to the current $i_a(t)$ flowing in this user port. In this case, the signal processing unit (2) may for instance perform an in-phase/quadrature (I/Q) demodulation (homodyne reception) of all sensing unit output signals, to obtain, for any integer a greater than or equal to 1 and less than or equal to m, four analog signals: the real part of $u_{E\ a}$ (t); the imaginary part of $u_{E\ a}$ (t); the real part of $i_{E\ a}$ (t); and the imaginary part of $i_{E\ a}$ (t). These analog signals may then be converted into digital signals and further processed in the digital domain, to estimate said q real quantities depending on the impedance matrix presented by the user ports, which fully characterize the impedance matrix presented by the user ports.

The tuning instruction may be of any type of digital message.

In this first embodiment, the tuning instruction is such that the impedance matrix presented by the user ports is substantially equal to a wanted impedance matrix given by $$Z_W = \begin{pmatrix} 50.0 & 0.0 & 0.0 & 0.0 \\ 0.0 & 50.0 & 0.0 & 0.0 \\ 0.0 & 0.0 & 50.0 & 0.0 \\ 0.0 & 0.0 & 0.0 & 50.0 \end{pmatrix} \Omega \quad (5)$$

Since, as explained above, the q real quantities depending on the impedance matrix presented by the user ports fully determine $Z_U$, the signal processing unit determines and delivers a tuning instruction such that the resulting tuning control signals produce a $Z_U$ such that a norm of $Z_U - Z_W$ is small or zero. The specialist understands how the tuning instruction can be determined. The operation of the signal processing unit is such that a tuning instruction is generated at the end of a tuning sequence, and is valid until a next tuning instruction is generated at the end of a next tuning sequence.

The external device also delivers "instructions of the external device" to the signal processing unit (2), said instructions of the external device informing the signal processing unit that said excitations have been applied, or are being applied, or will be applied. For instance, the external device may initiate a tuning sequence when it informs the signal processing unit that it will apply the excitations to the user ports. For instance, the signal processing unit may end the tuning sequence when, after the excitations have been applied, a tuning instruction has been delivered. Additionally, the external device provides other signals to the signal processing unit, and/or receives other signals from the signal processing unit. The electrical links needed to deliver said instructions of the external device and to carry such other signals are not shown in FIG. 1.

The target ports see, at said given frequency, an impedance matrix referred to as "the impedance matrix seen by the target ports" and denoted by $Z_A$. The impedance matrix seen by the target ports is a complex matrix of size n by n. The specialist understands that $Z_U$ depends on $Z_A$.

The multiple-input-port and multiple-output-port tuning unit (3) is an antenna tuning apparatus disclosed in said French patent application No. 12/02542 and in said international application PCT/IB2013/058423, having m input ports and n output ports. Thus, the multiple-input-port and multiple-output-port tuning unit is such that the reactance of any one of the adjustable impedance devices of the tuning unit has, at said given frequency, if the impedance matrix seen by the target ports is equal to a given diagonal impedance matrix, an influence on the impedance matrix presented by the user ports, and such that the reactance of at least one of the adjustable impedance devices of the tuning unit has, at said given frequency, if the impedance matrix seen by the target ports is equal to the given diagonal impedance matrix, an influence on at least one non-diagonal entry of the impedance matrix presented by the user ports. This must be interpreted as meaning: the multiple-input-port and multiple-output-port tuning unit is such that, at said given frequency, there exists a diagonal impedance matrix referred to as the given diagonal impedance matrix, the given diagonal impedance matrix being such that, if an impedance matrix seen by the target ports is equal to the given diagonal impedance matrix, then (a) the reactance of any one of the adjustable impedance devices of the tuning unit has an influence on an impedance matrix presented by the user ports, and (b) the reactance of at least one of the adjustable impedance devices of the tuning unit has an influence on at least one non-diagonal entry of the impedance matrix presented by the user ports.

Moreover, the multiple-input-port and multiple-output-port tuning unit (3) is such that, at said given frequency, if the impedance matrix seen by the target ports is equal to a given non-diagonal impedance matrix, a mapping associating the impedance matrix presented by the user ports to the p reactances is defined, the mapping having, at a given value of each of the p reactances, a partial derivative with respect to each of the p reactances, a span of the p partial derivatives being defined in the set of the complex matrices of size m by m considered as a real vector space, any diagonal complex matrix of size m by m having the same diagonal entries as at least one element of the span of the p partial derivatives. This must be interpreted as meaning: the multiple-input-port and multiple-output-port tuning unit is such that, at said given frequency, there exists a non-diagonal impedance matrix referred to as the given non-diagonal impedance matrix, the given non-diagonal impedance matrix being such that, if an impedance matrix seen by the target ports is equal to the given non-diagonal impedance matrix, then a mapping associating an impedance matrix presented by the user ports to the p reactances is defined, the mapping having, at a given value of each of the p reactances, a partial derivative with respect to each of the p reactances, a span of the p partial derivatives being defined in the set of the complex matrices of size m by m considered as a real vector space, any diagonal complex matrix of size m by m having the same diagonal entries as at least one element of the span of the p partial derivatives.

Thus, the specialist understands that any small variation in the impedance matrix seen by the target ports can be at least partially compensated with a new automatic adjustment of the adjustable impedance devices of the tuning unit.

The specialist knows that the dimension of the span of the p partial derivatives considered as a real vector space has been used and explained: in said French patent application No. 12/02542; in said international application PCT/IB2013/058423; and in the sections I, III, VI, VII and VIII of the article of F. Broydé and E. Clavelier entitled "Some Properties of Multiple-Antenna-Port and Multiple-User-Port Antenna Tuners", published in *IEEE Trans. on Circuits and Systems—I: Regular Papers*, Vol. 62, No. 2, pp. 423-432, in February 2015. In this article, said dimension of the span of the p partial derivatives is referred to as the local dimension of the user port impedance range, and denoted by $D_{UR}(Z_{Sant})$. A specialist understands that, to obtain that any diagonal complex matrix of size m by m has the same diagonal entries as at least one element of the span of the p partial derivatives, it is necessary that the dimension of the span of the p partial derivatives considered as a real vector space is greater than or equal to the dimension of the subspace of the diagonal complex matrices of size m by m considered as a real vector space. Since the dimension of the span of the p partial derivatives considered as a real vector space is less than or equal top, and since the dimension of the subspace of the diagonal complex matrices of size m by m considered as a real vector space is equal to 2m, the necessary condition implies that p is an integer greater than or equal to 2m. This is why the requirement "p is an integer greater than or equal to 2m" is an essential characteristic of this embodiment.

The characteristics of the multiple-input-port and multiple-output-port tuning unit (3) are such that the apparatus for automatically tuning an impedance matrix allows, at said given frequency, an almost lossless transfer of power from the user ports to the target ports, and an almost lossless transfer of power from the target ports to the user ports.

If the apparatus for automatically tuning an impedance matrix has each of its target ports coupled to one and only one of the ports of a multiport antenna array, the specialist understands that $Z_A$, depends on the frequency and on the electromagnetic characteristics of the volume surrounding the antennas. In particular, if the multiport antenna array is built in a portable transceiver, for instance a user equipment (UE) of an LTE wireless network, the body of the user has an effect on $Z_A$, and $Z_A$ depends on the position of the body of the user. This is referred to as "user interaction", or "hand effect" or "finger effect". The specialist understands that the apparatus for automatically tuning an impedance matrix may be used to compensate a variation in $Z_A$ caused by a variation in the frequency of operation, and/or to compensate the user interaction.

In order to respond to variations in $Z_A$ and/or in the operating frequency, the tuning instruction may be generated repeatedly. For instance, a new tuning sequence ending with the delivery of a new tuning instruction may start periodically, for instance every 10 milliseconds.

In this first embodiment, n=m=4. Thus, it is possible that n is greater than or equal to 3, it is possible that n is greater than or equal to 4, it is possible that m is greater than or equal to 3, and it is possible that m is greater than or equal to 4.

Second Embodiment

The second embodiment of a device of the invention, given by way of non-limiting example, also corresponds to the apparatus for automatically tuning an impedance matrix presented by m=4 user ports shown in FIG. 1, and all explanations provided for the first embodiment are applicable to this second embodiment. Additionally, in this second embodiment, the complex envelopes of the m excitations are orthogonal to each other. More precisely, the complex envelopes of the m excitations are orthogonal to one another, for a given scalar product. Moreover, the scalar product of any one of the m complex envelopes and itself is nonzero, so that the orthogonality requirements entail that the m complex envelopes are linearly independent. We may use <f|g> to denote the scalar product of two functions f and g, which may be any scalar product satisfying the properties of conjugate symmetry, linearity in the second argument, and positivity (we do not require positive definiteness). For instance, we may consider that each of said complex envelope is square-integrable, and that the scalar product is the usual scalar product of the Hilbert space of square-integrable functions of a real variable, which, for two square-integrable functions f and g, is given by $$\langle f \mid g \rangle = \int_{-\infty}^{\infty} \overline{f(x)} g(x) dx \qquad (6)$$

in which the bar above $f(x)$ denotes the complex conjugate. Alternatively, we may for instance consider that two functions f and g are sampled at the same points in time, to obtain the samples f[j] off and the samples g[j] of g, where j is an integer, and that the scalar product is the usual scalar product of finite energy sequences, which is given by $$\langle f \mid g \rangle = \sum_{j=-\infty}^{\infty} \overline{f[j]} g[j] \qquad (7)$$

Let us for instance consider the case in which the excitations are such that, for any integer a greater than or equal to 1 and less than or equal to m, the excitation number a consists of a current $i_a$ (t), of complex envelope $i_{E\,a}$ (t), applied to the user port number a, the complex envelopes $i_{E\,1}$ (t), ..., $i_{E\,m}$ (t) being orthogonal to each other. In this case, the equation (4) is applicable, and the coordinates of the vector $u_{E\,a}$ (t) in the basis $i_{E\,1}$ (t), ..., $i_{E\,m}$ (t) of S can be easily computed, since, for any integer b greater than or equal to 1 and less than or equal to m, the b-th coordinate of the vector $u_{E\,a}$ (t) in the basis $i_{E\,1}$ (t), ..., $i_{E\,m}$ (t), denoted by $Z_{a\,b}$ is clearly given by $$z_{ab} = \frac{\langle i_{Eb} \mid u_{Ea} \rangle}{\langle i_{Eb} \mid i_{Eb} \rangle} \qquad (8)$$

Moreover, in this case, the coordinates of the vector $u_{E\,a}$ (t) in the basis $i_{E\,1}$ (t), ..., $i_{E\,m}$ (t) being the entries of the row a of $Z_U$, we find that $z_{a\,b}$ is the entry of the row a and the column b of $Z_U$. Thus, the equation (8) can be used to derive $Z_U$ based on the knowledge of $u_E$ (t) and $i_E$ (t), where t is a variable. Thus, the effects of the different excitations can be identified with suitable signal processing, as if the different excitations had been applied successively to the user ports, so that the m excitations can be used to estimate the impedance matrix presented by the user ports, and any real quantity depending on the impedance matrix presented by the user ports.

We have just considered, as an example, the case in which the excitations are such that, for any integer a greater than or equal to 1 and less than or equal to m, the excitation number a consists of a current $i_a$ (t), of complex envelope $i_{E\,a}$ (t), applied to the user port number a, the complex envelopes $i_{E\,1}$ (t), ..., $i_{E\,m}$ (t) being orthogonal to each other. Alternatively, the excitations could for instance be such that, for any integer a greater than or equal to 1 and less than or equal to m, the excitation number a consists of a voltage $u_a$ (t), of complex envelope $u_{E\,a}$ (t), applied to the user port number a, the complex envelopes $u_{E\,1}$ (t), ..., $u_{E\,m}$ (t) being orthogonal to each other. In this case, using a proof similar to the one presented above for applied currents, we can show that the effects of the different excitations can be identified with suitable signal processing, as if the different excitations had been applied successively to the user ports, so that the m excitations can be used to estimate the impedance matrix presented by the user ports, and any real quantity depending on the impedance matrix presented by the user ports.

The specialist understands how to generate m excitations having complex envelopes which are orthogonal to one another. For instance, let us consider m arbitrary sequences of data symbols, each sequence being modulated on a single sub-carrier of an orthogonal frequency division multiplexing (OFDM) signal, different sequences being modulated on different sub-carriers. These m modulated sub-carriers are orthogonal to one another, so that each of these modulated sub-carriers could be used as the complex envelope of one of them excitations. For instance, orthogonality also exists between any two different resource elements of an OFDM signal (a resource element means one OFDM sub-carrier for the duration of one OFDM symbol), so that m different resource elements could each be used to obtain the complex envelope of one of the m excitations.

The specialist understands how the signal processing unit (2) can use the sensing unit output signals obtained for them excitations applied to the user ports, them excitations being bandpass signals having complex envelopes which are orthogonal to one another, to estimate q real quantities depending on the impedance matrix presented by the user ports. For instance, let us consider the case where the two sensing unit output signals of any one of said sensing units are proportional to a complex voltage across one of the user ports and to a complex current flowing in said one of the user ports, respectively, and where the excitation number a consists of a current applied to the user port number a. Based on the explanations about the equation (8), the specialist understands that all entries of $Z_U$ can be determined once the m different excitations have been applied.

For instance, if the sensing units (1) are numbered from 1 to m, we may consider the special case in which, for any integer a greater than or equal to 1 and less than or equal to m, the sensing unit number a delivers: a first sensing unit output signal proportional to the voltage $u_a(t)$ across the user port number a; and a second sensing unit output signal proportional to the current $i_a(t)$ flowing in the user port number a. In this case, the signal processing unit (2) may for instance perform a down-conversion of all sensing unit output signals, followed by an in-phase/quadrature (I/Q) demodulation (heterodyne reception), to obtain, for any integer a greater than or equal to 1 and less than or equal to m, four analog signals: the real part of $u_{E\,a}(t)$; the imaginary part of $u_{E\,a}(t)$; the real part of $i_{E\,a}(t)$; and the imaginary part of $i_{E\,a}(t)$. These analog signals may then be converted into digital signals and further processed in the digital domain, based on equation (7) and on equation (8) as explained above, to estimate said q real quantities depending on the impedance matrix presented by the user ports, which fully characterize the impedance matrix presented by the user ports.

Third Embodiment (Best Mode)

The third embodiment of a device of the invention, given by way of non-limiting example and best mode of carrying out the invention, also corresponds to the apparatus for automatically tuning an impedance matrix presented by m=4 user ports shown in FIG. 1, and all explanations provided for the first embodiment are applicable to this third embodiment. Additionally, in this third embodiment, each of the complex envelopes of the m excitations is the sum of a first complex signal and a second complex signal, the first complex signal being referred to as the primary component of the complex envelope, the second complex signal being referred to as the secondary component of the complex envelope, the primary components of the m complex envelopes being orthogonal to each other, each of the primary components of them complex envelopes being orthogonal to each of the secondary components of the m complex envelopes. More precisely, the primary components of the m complex envelopes are orthogonal to one another, for a given scalar product, and each of the primary components of the m complex envelopes is orthogonal to each of the secondary components of the m complex envelopes, for the given scalar product. Moreover, the scalar product of any one of the primary components of the m complex envelopes and itself is nonzero, so that the orthogonality requirements entail that the m complex envelopes are linearly independent.

Let us for instance consider the case in which the excitations are such that, for any integer a greater than or equal to 1 and less than or equal to m, the excitation number a consists of a current $i_a$ (t), of complex envelope $i_{E\,a}$ (t), applied to the user port number a, the complex envelope $i_{E\,a}(t)$ being of the form $$i_{Ea}(t)=i_{Ca}(t)+i_{Da}(t) \qquad (9)$$

where $i_{C\,a}$ (t) is the primary component of the complex envelope, and $i_{D\,a}$ (t) is the secondary component of the complex envelope, the primary components $i_{C\,1}$ (t), . . . , $i_{C\,m}$(t) of them complex envelopes being orthogonal to each other, and each of the primary components $i_{C\,1}$ (t), . . . , $i_{C\,m}$ (t) of the m complex envelopes being orthogonal to each of the secondary components $i_{D\,1}$ (t), . . . , $i_{D\,m}$ (t) of the m complex envelopes. In this case, the equation (4) is applicable, and the coordinates of the vector $u_{E\,a}(t)$ in the basis $i_{E\,1}$ (t), . . . , $i_{E\,m}$ (t) of S can be easily computed, since, for any integer b greater than or equal to 1 and less than or equal to m, the b-th coordinate of the vector $u_{E\,a}(t)$ in the basis $i_{E\,1}$ (t), . . . , $i_{E\,m}$ (t), denoted by $z_{a\,b}$ is clearly given by $$z_{ab} = \frac{\langle i_{Cb} | u_{Ea} \rangle}{\langle i_{Cb} | i_{Cb} \rangle} \qquad (10)$$

Moreover, in this case, the coordinates of the vector $u_{E\,a}$ (t) in the basis $i_{E\,1}$ (t), . . . , $i_{E\,m}$ (t) being the entries of the row a of $Z_U$, we find that $z_{a\,b}$ is the entry of the row a and the column b of $Z_U$. Thus, the equation (10) can be used to derive $Z_U$ based on the knowledge of $u_E$ (t) and $i_{C\,1}$ (t), . . . , $i_{C\,m}$ (t), where t is a variable. Thus, the effects of the different excitations can be identified with suitable signal processing, as if the different excitations had been applied successively to the user ports, so that the m excitations can be used to estimate the impedance matrix presented by the user ports, and any real quantity depending on the impedance matrix presented by the user ports.

We have just considered, as an example, the case in which the excitations are such that, for any integer a greater than or equal to 1 and less than or equal to m, the excitation number a consists of a current $i_a$ (t), of complex envelope $i_{E\,a}$ (t), applied to the user port number a, the complex envelope $i_{E\,a}$ (t) being the sum of $i_{C\,a}$ (t) and $i_{D\,a}$ (t), where $i_{C\,a}$ (t) is the primary component of the complex envelope, and $i_{D\,a}$ (t) is the secondary component of the complex envelope, the primary components $i_{C\,1}$, (t), . . . , $i_{C\,m}$ (t) of the m complex envelopes being orthogonal to each other, each of the primary components $i_{C\,1}$ (t), . . . , $i_{C\,m}$ (t) of the m complex envelopes being orthogonal to each of the secondary components $i_{D\,1}$ (t), . . . , $i_{D\,m}$ (t) of the m complex envelopes. Alternatively, the excitations could for instance be such that, for any integer a greater than or equal to 1 and less than or equal to m, the excitation number a consists of a voltage $u_a$ (t), of complex envelope $u_{E\,a}$(t), applied to the user port number a, the complex envelope $u_{E\,a}$(t) being the sum of $u_{C\,a}$ (t) and $u_{D\,a}$ (t), where $u_{C\,a}$(t) is the primary component of the complex envelope, and $U_{D\,a}$ (t) is the secondary component of the complex envelope, the primary components $u_{C\,1}$ (t), ..., $i_{C\,m}$ (t) of the m complex envelopes being orthogonal to each other, each of the primary components $u_{C\,1}$ (t), ..., $u_{C\,m}$ (t) of the m complex envelopes being orthogonal to each of the secondary components $u_{D\,1}$ (t), ..., $u_{D\,m}$ (t) of the m complex envelopes. In this case, using a proof similar to the one presented above for applied currents, we can show that the effects of the different excitations can be identified with suitable signal processing, as if the different excitations had been applied successively to the user ports, so that the m excitations can be used to estimate the impedance matrix presented by the user ports, and any real quantity depending on the impedance matrix presented by the user ports.

We observe that the type of excitations used in the second embodiment is a special case of the more general type of excitations used in this third embodiment, since excitations used in this third embodiment and having zero secondary components can be used in the second embodiment.

The specialist understands how to generate m excitations having complex envelopes, each of said complex envelopes being the sum of a first complex signal and a second complex signal, the first complex signal being referred to as the primary component of the complex envelope, the second complex signal being referred to as the secondary component of the complex envelope, the primary components of the m complex envelopes being orthogonal to each other, each of the primary components of the m complex envelopes being orthogonal to each of the secondary components of the m complex envelopes. For instance, let us consider m arbitrary sequences of data symbols, each sequence being modulated on a single sub-carrier of an OFDM signal, different sequences being modulated on different sub-carriers. The sub-carriers modulated by the m arbitrary sequences are orthogonal to one another, and each of them is orthogonal to any combination of sub-carriers which are not modulated by any one of the m arbitrary sequences, and which may carry any data. Thus, each of the sub-carriers modulated by the m arbitrary sequences could be used as the primary component of the complex envelope of one of the m excitations, and any combination of sub-carriers which are not modulated by any one of the m arbitrary sequences, and which may carry any data, could be used as the secondary component of the complex envelope of any one of them excitations. For instance, let us consider m different resource elements of an OFDM signal. The m different resource elements are orthogonal to one another, and each of the m different resource elements is orthogonal to any combination of resource elements which are not one of said m different resource elements. Thus, each of said m different resource elements could be used to obtain the primary component of the complex envelope of one of them excitations, and any combination of resource elements which are not one of said m different resource elements could be used to obtain the secondary component of the complex envelope of any one of the m excitations.

We observe that, in typical standards applicable to MIMO wireless networks, OFDM or single carrier frequency domain equalization (SC-FDE) is used for transmission, and different resource elements in different spatial layers (also referred to as "spatial streams") are used to provide reference signals (also referred to as "pilots") for MIMO channel estimation. Such a reference signal, considered in a given spatial layer, can be used as the primary component of the complex envelope of one of the m excitations, and any combination of resource elements which are not used by such a reference signal, considered in a given spatial layer and carrying data symbols, can be used to obtain the secondary component of the complex envelope of any one of the m excitations. This is because the reference signals meet suitable orthogonality relations. Consequently, this third embodiment is compatible with the requirements of standards typically applicable to MIMO wireless networks.

The specialist understands how the signal processing unit (2) can use the sensing unit output signals obtained for the m excitations applied to the user ports, them excitations being bandpass signals having complex envelopes which are the sum of a first complex signal and a second complex signal meeting the requirements of this third embodiment, to estimate q real quantities depending on the impedance matrix presented by the user ports. For instance, let us consider the case where the two sensing unit output signals of any one of said sensing units are proportional to a complex voltage across one of the user ports and to a complex current flowing in said one of the user ports, respectively, and where, for any integer a greater than or equal to 1 and less than or equal to m, the excitation number a consists of a current applied to the user port number a. Based on the explanations about the equation (10), the specialist understands that all entries of $Z_U$ can be determined once the m different excitations have been applied.

For instance, if the sensing units (1) are numbered from 1 to m, we may consider the special case in which, for any integer a greater than or equal to 1 and less than or equal to m, the sensing unit number a delivers: a first sensing unit output signal proportional to the voltage $u_a$(t) across the user port number a; and a second sensing unit output signal proportional to the current $i_a$(t) flowing in the user port number a. In this case, the signal processing unit (2) may for instance perform a down-conversion of all sensing unit output signals, followed by a conversion into digital signals using bandpass sampling, and by a digital quadrature demodulation, to obtain, for any integer a greater than or equal to 1 and less than or equal to m, four digital signals: the samples of the real part of $u_{E\,a}$ (t); the samples of the imaginary part of $u_{E\,a}$ (t); the samples of the real part of $i_{E\,a}$ (t); and the samples of the imaginary part of $i_{E\,a}$ (t). OFDM demodulation may for instance be used to obtain, for any integer a greater than or equal to 1 and less than or equal to m, the samples of the real part of $i_{C\,a}$ (t) and the samples of the imaginary part of $i_{C\,a}$ (t). These digital signals may then be further processed, based on equation (7) and on equation (10) as explained above, to estimate said q real quantities depending on the impedance matrix presented by the user ports, which fully characterize the impedance matrix presented by the user ports.

Fourth Embodiment

The fourth embodiment of a device of the invention, given by way of non-limiting example, also corresponds to the apparatus for automatically tuning an impedance matrix presented by m=4 user ports shown in FIG. 1, and all explanations provided for the first embodiment are applicable to this fourth embodiment. Additionally, we have represented in FIG. 2 the multiple-input-port and multipleoutput-port tuning unit (3) used in this fourth embodiment. This multiple-input-port and multiple-output-port tuning unit comprises:

n=4 output ports (311) (321) (331) (341);
m=4 input ports (312) (322) (332) (342);
n adjustable impedance devices of the tuning unit (301) each presenting a negative reactance and each being coupled in parallel with one of the output ports;
n(n−1)/2 adjustable impedance devices of the tuning unit (302) each presenting a negative reactance and each having a first terminal coupled to one of the output ports and a second terminal coupled to one of the output ports which is different from the output port to which the first terminal is coupled;
n=m windings (303) each having a first terminal coupled to one of the output ports and a second terminal coupled to one of the input ports;
m adjustable impedance devices of the tuning unit (304) each presenting a negative reactance and each being coupled in parallel with one of the input ports;
m (m−1)/2 adjustable impedance devices of the tuning unit (305) each presenting a negative reactance and each having a first terminal coupled to one of the input ports and a second terminal coupled to one of the input ports which is different from the input port to which the first terminal is coupled.

Figure 2:
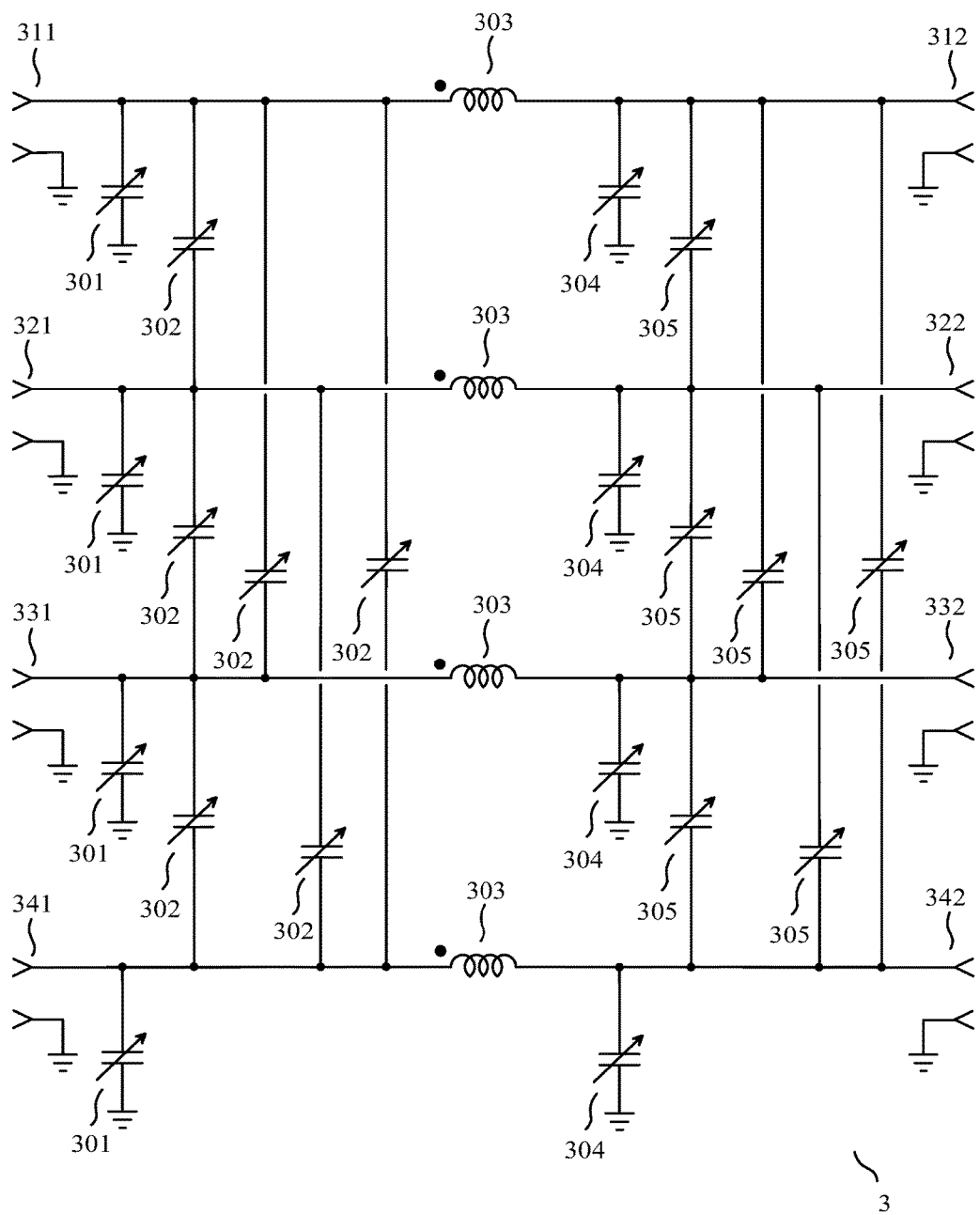
FIG. 2 shows a schematic diagram of a multiple-input-port and multiple-output-port tuning unit for simultaneously tuning 4 ports, which may be used in the apparatus for automatically tuning an impedance matrix shown in FIG. 1 (fourth embodiment)

As shown in FIG. 1 and FIG. 2, each of the output ports (311) (321) (331) (341) is directly coupled to one and only one of the target ports (111) (121) (131) (141), and each of the input ports (312) (322) (332) (342) is indirectly coupled to one and only one of the user ports (112) (122) (132) (142) through one of the sensing units (1). Thus, at said given frequency, the impedance matrix seen by the output ports is equal to the impedance matrix seen by the target ports. The sensing units are such that, at said given frequency, the impedance matrix presented by the input ports is close to the impedance matrix presented by the user ports.

It is possible that mutual induction exists between the windings (303). In this case, the inductance matrix of the windings is not a diagonal matrix.

All adjustable impedance devices of the tuning unit (301) (302) (304) (305) are adjustable by electrical means, but the circuits and the control links needed to determine the reactance of each of the adjustable impedance devices of the tuning unit are not shown in FIG. 2. In this fourth embodiment, we have n=m and we use p=m (m+1)=20 adjustable impedance devices of the tuning unit.

The specialist knows that the characteristics of the tuning unit shown in FIG. 2 have been investigated in: the article of F. Broydé and E. Clavelier, entitled "A New Multiple-Antenna-Port and Multiple-User-Port Antenna Tuner", published in *Proc. 2015 IEEE Radio & Wireless Week, RWW 2015*, at the pages 41 to 43, in January 2015; said article entitled "Some Properties of Multiple-Antenna-Port and Multiple-User-Port Antenna Tuners"; and the article of F. Broydé and E. Clavelier entitled "Two Multiple-Antenna-Port and Multiple-User-Port Antenna Tuners", published in *Proc. 9th European Conference on Antenna and Propagation, EuCAP 2015*, in April 2015.

The specialist understands that, at a frequency at which the multiple-input-port and multiple-output-port tuning unit is intended to operate, if the impedance matrix seen by the target ports is a diagonal matrix having all its diagonal entries equal to 50Ω, the reactance of any one of the adjustable impedance devices of the tuning unit has an influence on the impedance matrix presented by the user ports, and the reactance of one or more of the adjustable impedance devices of the tuning unit has an influence on one or more of the non-diagonal entries of the impedance matrix presented by the user ports.

The impedance matrix seen by the target ports being a given symmetric complex matrix, it is possible to show that, for suitable component values, the p partial derivatives defined above are linearly independent in the real vector space of the complex matrices of size m by m, this vector space being of dimension 2 m². In this vector space, the span of the p partial derivatives is a subspace of dimension p equal to the set of the symmetric complex matrices of size m by m. Here, any symmetric complex matrix of size m by m is an element of the span of the p partial derivatives. Consequently, any diagonal complex matrix of size m by m has the same diagonal entries as at least one element of the span of the p partial derivatives.

The reactance of an adjustable impedance device may depend on the ambient temperature, for some types of adjustable impedance devices. If such a type of adjustable impedance device is used in the multiple-input-port and multiple-output-port tuning unit, it is possible that the tuning control signals are determined as a function of the tuning instruction and as a function of temperature, to compensate the effect of temperature on the reactance of each of the adjustable impedance devices of the tuning unit.

The specialist understands that, if the impedance matrix seen by the target ports is symmetric, any small variation in the impedance matrix seen by the target ports can be compensated with a new adjustment of the adjustable impedance devices of the tuning unit. Thus, it is always possible to obtain that $Z_U$ approximates $Z_W$.

In this fourth embodiment, an adaptive process is implemented by the signal processing unit, during one or more tuning sequences. A first possible adaptive process is the following: during each of said tuning sequences, the signal processing unit estimates the real part and the imaginary part of the m² entries of $Z_U$, which are q=2 m² real quantities depending on the impedance matrix presented by the user ports; the signal processing unit computes the real part and the imaginary part of the m² entries of the admittance matrix presented by the user ports, which is equal to $Z_U^{-1}$; and the signal processing unit determines a tuning instruction such that a norm of the image of this admittance matrix, computed as said above, under a matrix function is reduced (so that we can also say that a norm of the image of $Z_U$ under a matrix function is reduced). A second possible adaptive process is the following: during each of said tuning sequences, the signal processing unit estimates the real part and the imaginary part of the m² entries of the admittance matrix presented by the user ports, which are q=2 m² real quantities depending on the impedance matrix presented by the user ports; and the signal processing unit determines a tuning instruction such that a norm of the image of this admittance matrix, estimated as said above, under a matrix function is reduced (so that we can also say that a norm of the image of $Z_U$ under a matrix function is reduced). A third possible adaptive process is the following: during each of said tuning sequences, the signal processing unit estimates the real part and the imaginary part of the m² entries of the admittance matrix presented by the user ports; and the signal processing unit determines a tuning instruction such that the admittance matrix presented by the user ports is substantially equal to a wanted admittance matrix equal to the inverse of $Z_W$.

The specialist understands that, in many possible applications, the impedance matrix seen by the target ports is a symmetric matrix, so that the impedance matrix presented by the user ports and the admittance matrix presented by the user ports are symmetric matrices which are each fully defined by m (m+1) real quantities. Thus, only m (m+1) real quantities depending on the impedance matrix presented by the user ports are needed to fully define the impedance matrix presented by the user ports and the admittance matrix presented by the user ports. The specialist understands how the three possible adaptive processes defined above can use this property and/or be modified to take advantage of this property.

The specialist understands the advantage of using the real part and the imaginary part of the entries of the admittance matrix presented by the user ports, which is related to the fact that the reactances of the adjustable impedance devices of the tuning unit (304) (305) each having a terminal coupled to one of the input ports have no influence on the real part of the admittance matrix presented by the user ports. Thus, it is possible to first determine a variation of the reactances of them (m+1)/2 adjustable impedance devices of the tuning unit (301) (302) each having a terminal coupled to one of the output ports, to decrease or minimize a norm of the image of the real part of $Z_U^{-1}$ under a matrix function; and then to determine a variation of the reactances of them (m+1)/2 adjustable impedance devices of the tuning unit (304) (305) each having a terminal coupled to one of the input ports, to decrease or minimize a norm of the image of the imaginary part of $Z_U^{-1}$ under a matrix function. The specialist understands why this approach is advantageous to determine a tuning instruction.

The specialist understands that, if the impedance matrix seen by the target ports is a symmetric matrix, any small variation in the impedance matrix seen by the target ports can be automatically compensated. Thus, it is always possible to automatically and exactly tune the impedance matrix presented by the user ports.

Fifth Embodiment

The fifth embodiment of a device of the invention, given by way of non-limiting example, also corresponds to the apparatus for automatically tuning an impedance matrix presented by m=4 user ports shown in FIG. 1, and all explanations provided for the first embodiment are applicable to this fifth embodiment. Additionally, we have represented in FIG. 3 the multiple-input-port and multiple-output-port tuning unit (3) used in this fifth embodiment. This multiple-input-port and multiple-output-port tuning unit comprises:

n=4 output ports (311) (321) (331) (341);
m=4 input ports (312) (322) (332) (342);
n adjustable impedance devices of the tuning unit (301) each presenting a negative reactance and each being coupled in parallel with one of the output ports;
n (n−1)/2 capacitors (306) each having a first terminal coupled to one of the output ports and a second terminal coupled to one of the output ports which is different from the output port to which the first terminal is coupled;
n=m windings (303) each having a first terminal coupled to one of the output ports and a second terminal coupled to one of the input ports;
m adjustable impedance devices of the tuning unit (304) each presenting a negative reactance and each being coupled in parallel with one of the input ports;
m (m−1)/2 capacitors (307) each having a first terminal coupled to one of the input ports and a second terminal coupled to one of the input ports which is different from the input port to which the first terminal is coupled.

Figure 3:
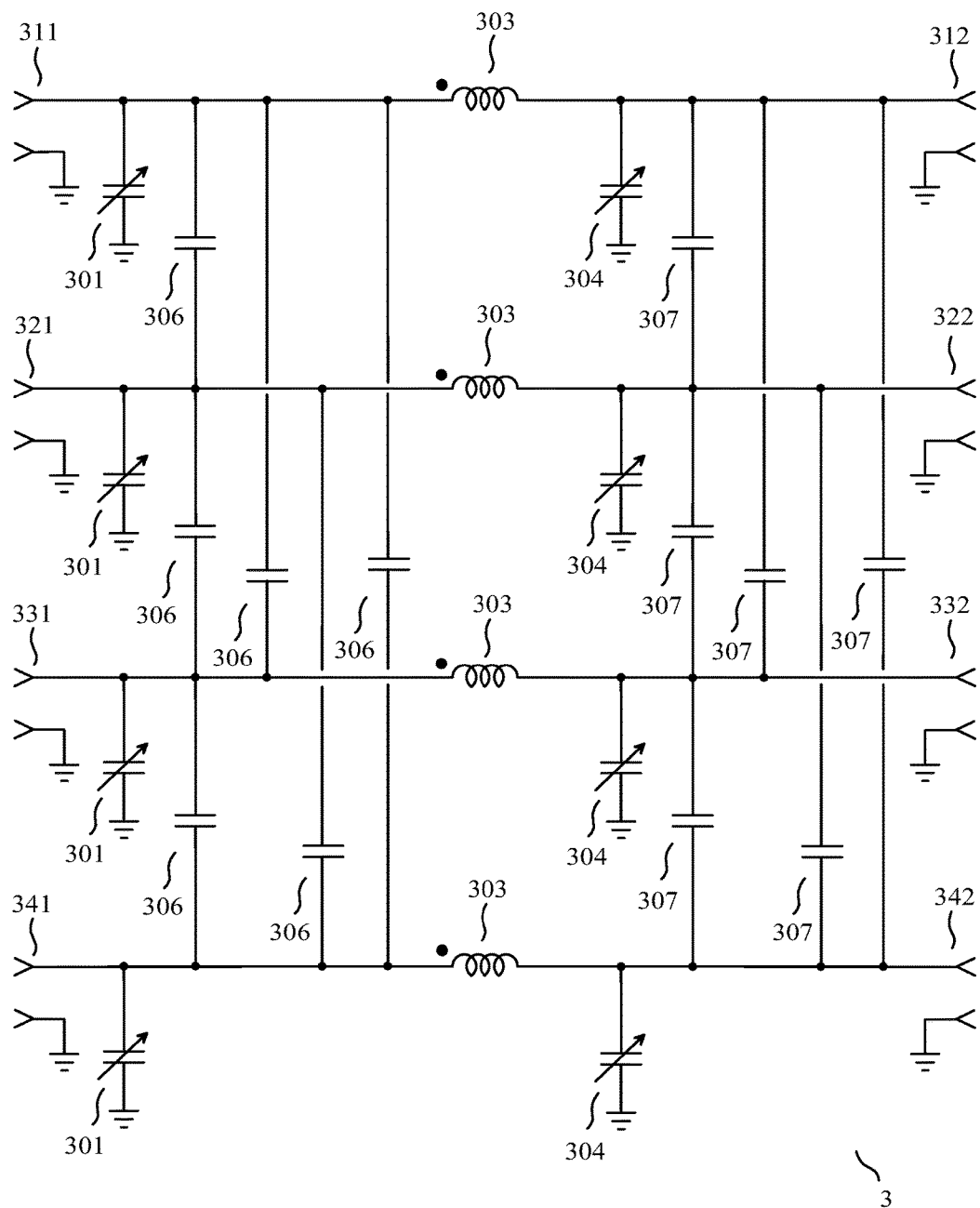
FIG. 3 shows a schematic diagram of a multiple-input-port and multiple-output-port tuning unit for simultaneously tuning 4 ports, which may be used in the apparatus for automatically tuning an impedance matrix shown in FIG. 1 (fifth embodiment)

As shown in FIG. 1 and FIG. 3, each of the output ports (311) (321) (331) (341) is directly coupled to one and only one of the target ports (111) (121) (131) (141), and each of the input ports (312) (322) (332) (342) is indirectly coupled to one and only one of the user ports (112) (122) (132) (142) through one of the sensing units (1). Thus, at said given frequency, the impedance matrix seen by the output ports is equal to the impedance matrix seen by the target ports. The sensing units are such that, at said given frequency, the impedance matrix presented by the input ports is close to the impedance matrix presented by the user ports.

It is possible that mutual induction exists between the windings (303). In this case, the inductance matrix of the windings is not a diagonal matrix. All adjustable impedance devices of the tuning unit (301) (304) are adjustable by electrical means, but the circuits and the control links needed to determine the reactance of each of the adjustable impedance devices of the tuning unit are not shown in FIG. 3.

The specialist understands that, at a frequency at which the multiple-input-port and multiple-output-port tuning unit is intended to operate, if the impedance matrix seen by the target ports is a diagonal matrix having all its diagonal entries equal to 50Ω, the reactance of any one of the adjustable impedance devices of the tuning unit has an influence on $Z_U$, and the reactance of one or more of the adjustable impedance devices of the tuning unit has an influence on one or more of the non-diagonal entries of $Z_U$. For suitable component values, it is possible to show that the p=8 partial derivatives defined above are linearly independent in the real vector space of dimension 32 of the complex matrices of size 4 by 4. In this vector space, the span of the p partial derivatives is of dimension 8. It is also possible to show that any diagonal complex matrix of size m by m has the same diagonal entries as at least one element of the span of the p partial derivatives.

In this fifth embodiment, an adaptive process is implemented by the signal processing unit, during one or more tuning sequences. The adaptive process is the following: during each of said tuning sequences, the signal processing unit estimates a norm of the matrix of the voltage reflection coefficients at the user ports, for a finite set of tuning instructions, and a tuning instruction producing the smallest norm is selected. The specialist understands that this adaptive process involves much less computations than the adaptive processes considered in the fourth embodiment. The specialist understands that the adaptive process of this fifth embodiment is very simple in the case where each of the sensing units is such that the two sensing unit output signals delivered by said each of the sensing units comprise: a first sensing unit output signal proportional to an incident voltage at one of the user ports; and a second sensing unit output signal proportional to a reflected voltage at said one of the user ports.

The specialist understands that any small variation in the impedance matrix seen by the target ports can be partially compensated with a new adjustment of the adjustable impedance devices of the tuning unit, the compensation being automatic and usually better in the case where the impedance matrix seen by the target ports and the wanted impedance matrix are symmetric matrices. Thus, it is always possible to automatically and approximately tune the impedance matrix presented by the user ports.

If the capacitors (306) (307) have a value equal to 0 pF (or are not present in the circuit shown in FIG. 3), and if mutual induction does not exist between the windings (303), we see that the multiple-input-port and multiple-output-port tuning unit (3) is in fact composed of 4 single-input-port and single-output-port tuning units, these single-input-port and single-output-port tuning units being independent and uncoupled. More generally, an apparatus for automatically tuning an impedance matrix presented by m user ports, the apparatus having said m user ports and n target ports, may, in the case n=m, be such that its multiple-input-port and multiple-output-port tuning unit is composed of n single-input-port and single-output-port tuning units, each comprising one or more of said adjustable impedance devices of the tuning unit, or two or more of said adjustable impedance devices of the tuning unit, these single-input-port and single-output-port tuning units being independent and uncoupled.

In this case, the method of the invention may become a method for automatically tuning an impedance matrix presented, at a given frequency, by n ports of an apparatus, where n is an integer greater than or equal to 2, each of said n ports being referred to as "user port", the apparatus having said n user ports and n other ports, each of said n other ports being referred to as "target port", said impedance matrix being referred to as "the impedance matrix presented by the user ports" and denoted by $Z_U$, the apparatus allowing, at said given frequency, a transfer of power from the user ports to the target ports, the method comprising the steps of:

applying n excitations to the user ports, one and only one of the excitations being applied to each of the user ports, two or more of the excitations being applied simultaneously;

estimating q real quantities depending on the impedance matrix presented by the user ports, where q is an integer greater than or equal to n, using said n excitations;

using said q real quantities depending on the impedance matrix presented by the user ports, to obtain "tuning control signals";

adjusting the impedance matrix presented by the user ports using n single-input-port and single-output-port tuning units, each of said single-input-port and single-output-port tuning units comprising one or more (or two or more) adjustable impedance devices, each of the adjustable impedance devices of said each of said single-input-port and single-output-port tuning units having a reactance at said given frequency, the reactance of any one of the adjustable impedance devices having an influence on the impedance matrix presented by the user ports, the reactance of any one of the adjustable impedance devices being adjustable by electrical means; and applying each of the tuning control signals to one or more of the adjustable impedance devices, the reactance of each of the adjustable impedance devices being mainly determined by one or more of the tuning control signals.

An apparatus implementing this method is an apparatus for automatically tuning an impedance matrix presented, at a given frequency, by n ports of the apparatus, where n is an integer greater than or equal to 2, each of said n ports being referred to as "user port", the apparatus having said n user ports and n other ports, each of said n other ports being referred to as "target port", said impedance matrix being referred to as "the impedance matrix presented by the user ports" and denoted by $Z_U$, the apparatus allowing, at said given frequency, a transfer of power from the user ports to the target ports, the apparatus comprising:

at least n sensing units, each of the sensing units delivering one or more "sensing unit output signals", each of the sensing unit output signals being mainly determined by one or more electrical variables;

a signal processing unit, the signal processing unit estimating q real quantities depending on the impedance matrix presented by the user ports, where q is an integer greater than or equal to n, using the sensing unit output signals obtained for n excitations applied to the user ports, one and only one of the excitations being applied to each of the user ports, two or more of the excitations being applied simultaneously, the signal processing unit delivering a "tuning instruction" as a function of said q real quantities depending on the impedance matrix presented by the user ports;

n single-input-port and single-output-port tuning units, each of said single-input-port and single-output-port tuning units comprising one or more (or two or more) adjustable impedance devices, each of the adjustable impedance devices of said each of said single-input-port and single-output-port tuning units having a reactance at said given frequency, the reactance of any one of the adjustable impedance devices having an influence on the impedance matrix presented by the user ports, the reactance of any one of the adjustable impedance devices being adjustable by electrical means; and a tuning control unit, the tuning control unit receiving the tuning instruction from the signal processing unit, the tuning control unit delivering "tuning control signals" to the single-input-port and single-output-port tuning units, the tuning control signals being determined as a function of the tuning instruction, the reactance of each of the adjustable impedance devices being mainly determined by one or more of the tuning control signals.

Sixth Embodiment

Figure 4:
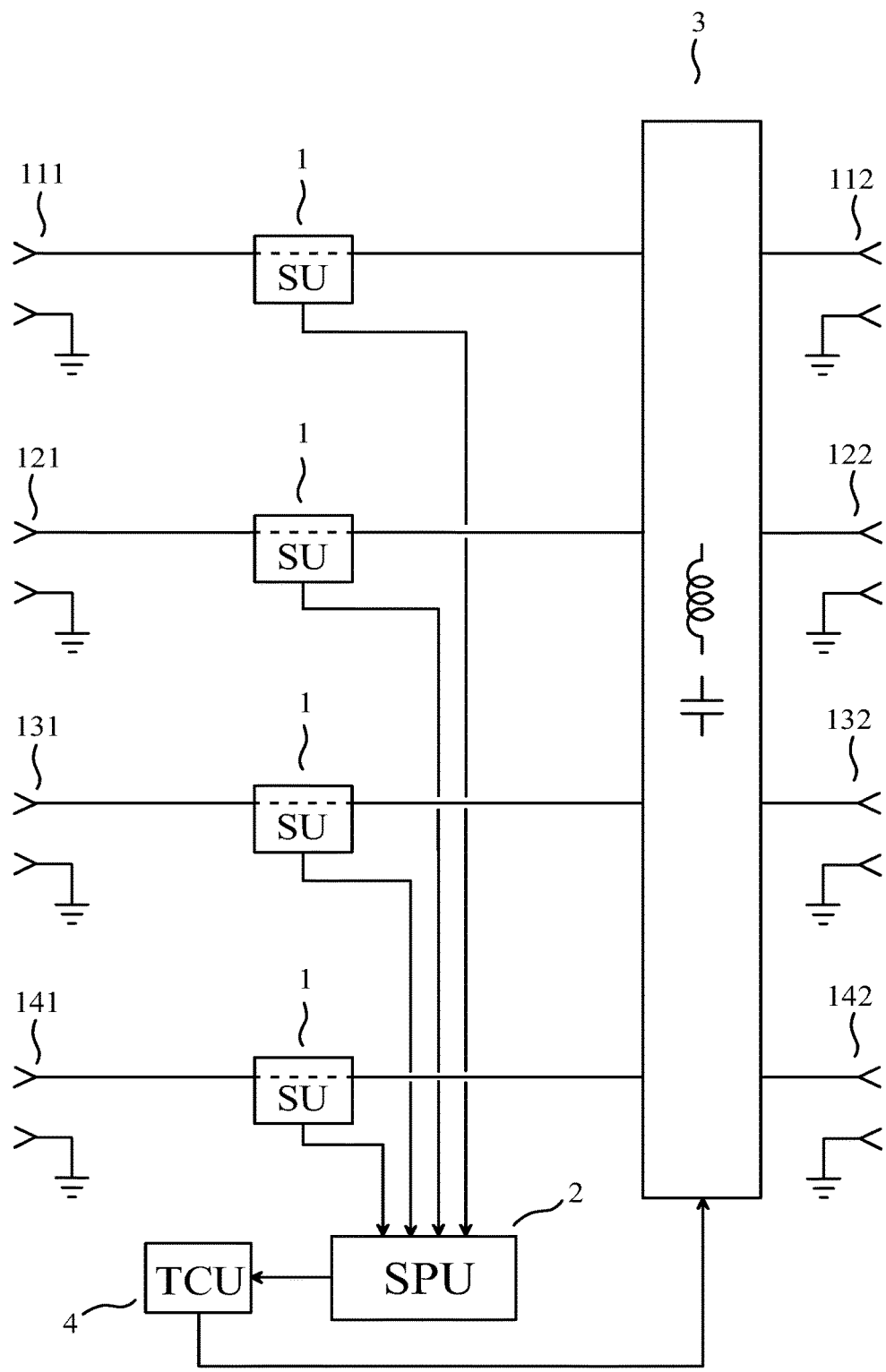
FIG. 4 shows the block diagram of an apparatus for automatically tuning an impedance matrix presented by 4 user ports (sixth embodiment)

As a sixth embodiment of a device of the invention, given by way of non-limiting example, we have represented in FIG. 4 the block diagram of an apparatus for automatically tuning an impedance matrix presented by m=4 user ports, at a given frequency greater than or equal to 300 MHz, the apparatus having said m user ports (112) (122) (132) (142) and n=4 target ports (111) (121) (131) (141), the impedance matrix being referred to as "the impedance matrix presented by the user ports", the apparatus comprising:

m sensing units (1), each of the sensing units delivering two "sensing unit output signals", each of the sensing unit output signals being determined by one electrical variable;

a signal processing unit (2), the signal processing unit estimating q real quantities depending on the impedance matrix presented by the user ports, where q is an integer greater than or equal to m, using the sensing unit output signals obtained for m excitations applied to the user ports, one and only one of the excitations being applied to each of the user ports, the m excitations being bandpass signals which are not applied successively, the signal processing unit delivering a "tuning instruction" as a function of said q real quantities depending on the impedance matrix presented by the user ports;

a multiple-input-port and multiple-output-port tuning unit (3), the multiple-input-port and multiple-output-port tuning unit comprising p adjustable impedance devices, where p is an integer greater than or equal to 2m=8, the p adjustable impedance devices being referred to as "the adjustable impedance devices of the tuning unit"

and being such that, at said given frequency, each of the adjustable impedance devices of the tuning unit has a reactance, the reactance of any one of the adjustable impedance devices of the tuning unit having an influence on the impedance matrix presented by the user ports, the reactance of any one of the adjustable impedance devices of the tuning unit being adjustable by electrical means; and a tuning control unit (4), the tuning control unit receiving the tuning instruction from the signal processing unit (2), the tuning control unit delivering "tuning control signals" to the multiple-input-port and multiple-output-port tuning unit (3), the tuning control signals being determined as a function of the tuning instruction, the reactance of each of the adjustable impedance devices of the tuning unit being mainly determined by one or more of the tuning control signals.

Each of the sensing units (1) may for instance be such that the two sensing unit output signals delivered by said each of the sensing units comprise: a first sensing unit output signal proportional to a first electrical variable, the first electrical variable being a voltage across one of the target ports; and a second sensing unit output signal proportional to a second electrical variable, the second electrical variable being a current flowing in said one of the target ports. Said voltage across one of the target ports may be a complex voltage and said current flowing in said one of the target ports may be a complex current. Alternatively, each of the sensing units (1) may for instance be such that the two sensing unit output signals delivered by said each of the sensing units comprise: a first sensing unit output signal proportional to a first electrical variable, the first electrical variable being an incident voltage at one of the target ports; and a second sensing unit output signal proportional to a second electrical variable, the second electrical variable being a reflected voltage at said one of the target ports. Said incident voltage at one of the target ports may be a complex incident voltage and said reflected voltage at said one of the target ports may be a complex reflected voltage.

The specialist understands the consequences of the fact that, in this sixth embodiment, the sensing unit output signals are determined by electrical variables measured at the target ports, whereas, in the first embodiment, the sensing unit output signals are determined by electrical variables measured at the user ports. The specialist understands how, taking this fact into account, the signal processing unit can use the sensing unit output signals to estimate q real quantities depending on the impedance matrix presented by the user ports. A consequence of this fact is for instance that, in this sixth embodiment, particular computations are needed to derive real quantities representative of the impedance matrix presented by the user ports. For instance, such particular computations may require the knowledge of the reactance of each of the adjustable impedance devices of the tuning unit, corresponding to a tuning instruction which was valid when the electrical variables were measured at the target ports. The specialist notes that, in said patent of the U.S. Pat. No. 8,299,867, a single sensing unit output signal is determined by an electrical variable measured at a single target port.

An external device has m output ports, each of the output ports of the external device being coupled to one and only one of the user ports, each of the user ports being coupled to one and only one of the output ports of the external device. The external device is not shown in FIG. 4. The external device applies the excitations to the user ports. The external device also delivers "instructions of the external device" to the signal processing unit (2), said instructions of the external device informing the signal processing unit that one or more of said excitations have been applied, or are being applied, or will be applied. Additionally, the external device provides other signals to the signal processing unit, and/or receives other signals from the signal processing unit. The electrical links needed to deliver said instructions of the external device and to carry such other signals are not shown in FIG. 4.

In this sixth embodiment, an adaptive process is carried out by the signal processing unit, during one or more tuning sequences. The adaptive process is the following: during each of said tuning sequences, the signal processing unit estimates the real part and the imaginary part of the impedance matrix presented by the user ports, and uses a lookup table (also spelled "look-up table") to determine a tuning instruction. The specialist understands how to build and use such a lookup table.

Seventh Embodiment

Figure 5:
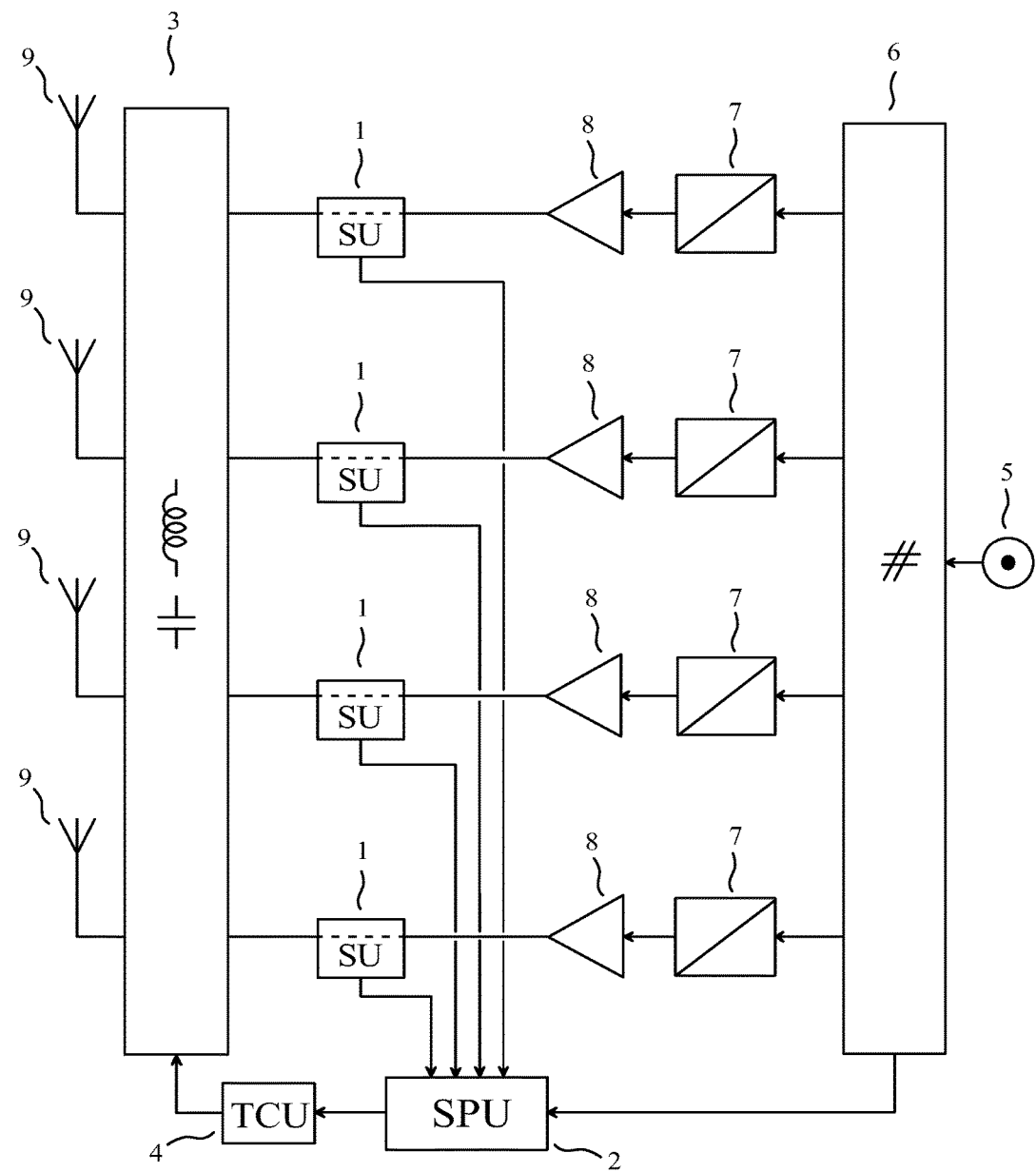
FIG. 5 shows the block diagram of a transmitter for radio communication using several antennas and the apparatus for automatically tuning an impedance matrix shown in FIG. 1 (seventh embodiment).

As a seventh embodiment of a device of the invention, given by way of non-limiting example, we have represented in FIG. 5 the block diagram of a transmitter for radio communication using an apparatus for automatically tuning an impedance matrix of the invention. The transmitter for radio communication shown in FIG. 5 is a transmitter for radio communication with multiple antennas in a given frequency band, comprising:

n=4 antenna output ports, each of the antenna output ports being coupled to an antenna (9);

a multiple-output signal processing device (6) processing a signal delivered by a source (5), the multiple-output signal processing device having m=4 signal outputs, each of the signal outputs delivering a digital signal when said each of the signal outputs is active, the multiple-output signal processing device delivering "tuning sequence instructions" which indicate when a tuning sequence is being performed, m excitations being applied during said tuning sequence, each of said m excitations corresponding to a digital signal delivered by one and only one of the signal outputs during said tuning sequence, two or more of the signal outputs being simultaneously active during said tuning sequence;

m conversion and analog processing circuits (7), each of the signal outputs of the multiple-output signal processing device (6) being coupled to an input of one of the conversion and analog processing circuits, each of the conversion and analog processing circuits having an output which delivers an analog signal in said given frequency band;

m power amplifiers (8), each of the power amplifiers having an input which is coupled to the output of one of the conversion and analog processing circuits (7), each of the power amplifiers having an output port, the power amplifiers delivering said excitations at the output ports of the power amplifiers, the impedance matrix seen, at a frequency in said given frequency band, by the output ports of the power amplifiers being referred to as "the impedance matrix seen by the output ports of the power amplifiers";

m sensing units (1), each of the sensing units delivering one or more "sensing unit output signals", each of the sensing unit output signals being determined by one or more electrical variables;

a signal processing unit (2), the signal processing unit estimating q real quantities depending on the impedance matrix seen by the output ports of the power amplifiers, where q is an integer greater than or equal to m, using the tuning sequence instructions and the sensing unit output signals obtained during a tuning sequence, the signal processing unit delivering a "tuning instruction" as a function of said q real quantities depending on the impedance matrix seen by the output ports of the power amplifiers;

a multiple-input-port and multiple-output-port tuning unit (3), which is identical to the one used in the first embodiment, each of the output ports of the multiple-input-port and multiple-output-port tuning unit being coupled to one and only one of the antennas through one of the antenna output ports, each of the input ports of the multiple-input-port and multiple-output-port tuning unit being coupled to one and only one of the output ports of the power amplifiers through one of the sensing units;

a tuning control unit (4), which is identical to the one used in the first embodiment.

The specialist understands that the "antenna output ports" of this seventh embodiment correspond to the "target ports" of the first embodiment, and that "the impedance matrix seen by the output ports of the power amplifiers" of this seventh embodiment corresponds to "the impedance matrix presented by the user ports" of the first embodiment. Consequently, based on the presentations of the first, fourth and fifth embodiments, the specialist sees that:

the multiple-input-port and multiple-output-port tuning unit may be such that any diagonal entry of the impedance matrix seen by the output ports of the power amplifiers is influenced by the reactance of at least one of the adjustable impedance devices of the tuning unit;

the multiple-input-port and multiple-output-port tuning unit may be such that the reactance of at least one of the adjustable impedance devices of the tuning unit has an influence on at least one non-diagonal entry of the impedance matrix seen by the output ports of the power amplifiers; and the transmitter for radio communication may be such that n=m, and such that the multiple-input-port and multiple-output-port tuning unit is composed of n single-input-port and single-output-port tuning units each comprising one or more of said adjustable impedance devices of the tuning unit.

The transmitter for radio communication may be such that the sensing unit output signals delivered by each of the sensing units comprise: a first sensing unit output signal proportional to a first electrical variable, the first electrical variable being a voltage across one of the output ports of the power amplifiers; and a second sensing unit output signal proportional to a second electrical variable, the second electrical variable being a current flowing in said one of the output ports of the power amplifiers. The transmitter for radio communication may be such that the sensing unit output signals delivered by each of the sensing units comprise: a first sensing unit output signal proportional to a first electrical variable, the first electrical variable being an incident voltage at one of the output ports of the power amplifiers; and a second sensing unit output signal proportional to a second electrical variable, the second electrical variable being a reflected voltage at said one of the output ports of the power amplifiers.

The tuning instruction may be such that the impedance matrix seen by the output ports of the power amplifiers is substantially equal to a wanted impedance matrix.

The transmitter for radio communication is used for MIMO wireless transmission in a cellular network. During a tuning sequence, each of said m excitations corresponds, as said above, to a digital signal delivered by one and only one of the signal outputs of the multiple-output signal processing device (6). For instance, as explained in the third embodiment, each of said digital signal may comprise a reference signal used for MIMO channel estimation, and, possibly other signals.

During each of said excitations, each of the power amplifiers presents a known impedance at its output port and the short-circuit current of the Norton equivalent circuit of the output port of said each of the power amplifiers is also known. Thus, the specialist understands that the measurement of complex voltages at the output ports of the power amplifiers is sufficient to derive all entries of the impedance matrix seen by the output ports of the power amplifiers. Consequently, each of the sensing units (1) may for instance deliver a single sensing unit output signal proportional to an electrical variable, the electrical variable being a voltage across one of the output ports of the power amplifiers, said voltage being a complex voltage.

The specialist understands that any small variation in the impedance matrix of the multiport antenna array formed by the antennas, caused by a change in operating frequency or a change in the medium surrounding the antennas, for instance due to user interaction, can be compensated with an automatic adjustment of the adjustable impedance devices of the tuning unit, to obtain that the impedance matrix seen by the output ports of the power amplifiers remains close to a wanted impedance matrix, for instance the wanted impedance matrix given by the equation (5). Thus, it is always possible to obtain the best performance from the transmitter for radio communication with multiple antennas.

Consequently, this seventh embodiment provides a solution to the problem of automatically tuning an impedance matrix seen by a radio transmitter used for MIMO wireless communication, in a manner that complies with standards typically applicable to MIMO wireless networks.

Eighth Embodiment

The eighth embodiment of a device of the invention, given by way of non-limiting example, also corresponds to the transmitter for radio communication shown in FIG. 5, and all explanations provided for the seventh embodiment are applicable to this eighth embodiment. Additionally, in this eighth embodiment, the signal processing unit (2) delivers the "tuning instruction" as a function of said q real quantities depending on the impedance matrix seen by the output ports of the power amplifiers, and as a function of one or more localization variables, each of the localization variables depending on the distance between a part of a human body and a zone of the transmitter for radio communication.

It is said above that each of the localization variables depends on the distance between a part of a human body and a zone of the transmitter for radio communication. This must be interpreted as meaning: each of the localization variables is such that there exists at least one configuration in which the distance between a part of a human body and a zone of the transmitter for radio communication has an effect on said each of the localization variables.

For instance, a "localization sensor unit" may estimate one or more localization variables each depending, in a given use configuration, on the distance between a part of a human body and a zone of the transmitter for radio communication. The localization sensor unit may comprise a plurality of localization sensors. Each of said zones may be a part of the space occupied by the corresponding localization sensor, this space being inside the space occupied by the transmitter for radio communication, so that in this case each of said zones has a volume much less than the volume of the transmitter for radio communication. For each of the antennas, at least one of the localization variables may depend on the distance between a part of a human body and a small zone near said each of the antennas. If a suitable localization sensor is used, said zone may be a point, or substantially a point.

For instance, at least one of the localization variables may be an output of a localization sensor responsive to a pressure exerted by a part of a human body. For instance, at least one of the localization variables may be an output of a proximity sensor.

The localization sensor unit assesses (or equivalently, estimates) a plurality of localization variables each depending, in a given use configuration, on the distance between a part of a human body and a zone of the transmitter for radio communication. However, it is possible that one or more other localization variables each depending, in a given use configuration, on the distance between a part of a human body and a zone of the transmitter for radio communication, are not estimated by the localization sensor unit. For instance, at least one of the localization variables may be determined by a change of state of an output of a touchscreen. Thus, the localization sensor unit may be regarded as a part of a localization unit which estimates (or evaluates) a plurality of variables, each of said variables being referred to as "localization variable", each of the localization variables depending on the distance between a part of a human body and a zone of the transmitter for radio communication. This part of the localization unit may be the whole localization unit.

This eighth embodiment may possibly use some aspects of the technique disclosed in the French patent application No. 14/00606 of 13 Mar. 2014 entitled "Communication radio utilisant des antennes multiples et des variables de localisation", corresponding to the international application No. PCT/IB2015/051548 of 3 Mar. 2015 entitled "Radio communication using multiple antennas and localization variables".

Ninth Embodiment

The ninth embodiment of a device of the invention, given by way of non-limiting example, also corresponds to the transmitter for radio communication shown in FIG. 5, and all explanations provided for the seventh embodiment are applicable to this ninth embodiment. Additionally, in this ninth embodiment, at least one tunable passive antenna is among said n antennas, said at least one tunable passive antenna comprising at least one antenna control device, one or more characteristics of said at least one tunable passive antenna being controlled using said at least one antenna control device, said at least one antenna control device having at least one parameter having an influence on said one or more characteristics, said at least one parameter being adjustable by electrical means, each of said parameters being mainly determined by one or more "antenna control signals". In the previous sentence, "each of said parameters" clearly means "each said at least one parameter of each said at least one antenna control device of each said at least one tunable passive antenna".

Many different types of antenna control device may be used to control one or more characteristics of any one of the tunable passive antennas. A suitable antenna control device may for instance be:
an electrically controlled switch or change-over switch, in which case a parameter of the antenna control device having an influence on one or more characteristics of the tunable passive antenna may be the state of the switch or change-over switch;
an adjustable impedance device, in which case a parameter of the antenna control device having an influence on one or more characteristics of the tunable passive antenna may be the reactance or the impedance of the adjustable impedance device at a specified frequency; or
an actuator arranged to produce a mechanical deformation of the tunable passive antenna, in which case a parameter of the antenna control device having an influence on one or more characteristics of the tunable passive antenna may be a length of the deformation.

If an antenna control device is an electrically controlled switch or change-over switch, it may for instance be an electro-mechanical relay, or a microelectromechanical switch (MEMS switch), or a circuit using one or more PIN diodes and/or one or more insulated-gate field-effect transistors (MOSFETs) as switching devices.

This ninth embodiment may possibly use some aspects of the technique disclosed in the French patent application No. 14/00666 of 20 Mar. 2014, entitled "Communication radio utilisant des antennes accordables et un appareil d'accord d'antenne", corresponding to the international application No. PCT/IB2015/051644 of 6 Mar. 2015 entitled "Radio communication using tunable antennas and an antenna tuning apparatus".

Tenth Embodiment

The tenth embodiment of a device of the invention, given by way of non-limiting example, is a transmitter for radio communication with a plurality of antennas in a given frequency band, comprising:
N antennas, where N is an integer greater than or equal to 3, each of the N antennas being such that it can operate at any frequency in the given frequency band;
n antenna output ports, where n is an integer greater than or equal to 2 and less than or equal to N minus 1;
m power amplifiers, where m is an integer greater than or equal to 2, each of the power amplifiers having an output port, each of the power amplifiers being able to deliver at its output port a power in said given frequency band, a part of said power being transferred to the antenna output ports, the output ports of the power amplifiers seeing, at a frequency in said given frequency band, an impedance matrix referred to as "the impedance matrix seen by the output ports of the power amplifiers", the impedance matrix seen by the output ports of the power amplifiers being a complex matrix of size m by m;
at least m sensing units, each of the sensing units delivering one or more "sensing unit output signals", each of the sensing unit output signals being mainly determined by one or more electrical variables;
a signal processing unit, the signal processing unit estimating q real quantities depending on the impedance matrix seen by the output ports of the power amplifiers, where q is an integer greater than or equal to n, using the sensing unit output signals obtained for m excitations applied by the power amplifiers at the output ports of the power amplifiers, one and only one of the excitations being applied at each of the output ports of the power amplifiers, two or more of the excitations being applied simultaneously, the signal processing unit delivering a "tuning instruction" as a function of said q real quantities depending on the impedance matrix seen by the output ports of the power amplifiers, the signal processing unit delivering a "configuration instruction";

a switching unit comprising N antenna ports and n array ports, each of the N antenna ports being coupled, directly or indirectly, to one of the N antennas, each of then array ports being coupled, directly or indirectly, to one of the n antenna output ports, the switching unit operating in an active configuration determined by the configuration instruction, the active configuration being one of a plurality of allowed configurations, the switching unit providing, in any one of the allowed configurations, for signals in the given frequency band and for any one of the array ports, a bidirectional path between said any one of the array ports and one and only one of the antenna ports;

a multiple-input-port and multiple-output-port tuning unit, having m input ports and n output ports, the multiple-input-port and multiple-output-port tuning unit comprising p adjustable impedance devices, where p is an integer greater than or equal to 2m, the p adjustable impedance devices being referred to as "the adjustable impedance devices of the tuning unit" and being such that, at said frequency in said given frequency band, each of the adjustable impedance devices of the tuning unit has a reactance, the reactance of any one of the adjustable impedance devices of the tuning unit having an influence on the impedance matrix presented by the user ports, the reactance of any one of the adjustable impedance devices of the tuning unit being adjustable by electrical means; and a tuning control unit, the tuning control unit receiving the tuning instruction from the signal processing unit, the tuning control unit delivering "tuning control signals" to the multiple-input-port and multiple-output-port tuning unit, the tuning control signals being determined as a function of the tuning instruction, the reactance of each of the adjustable impedance devices of the tuning unit being mainly determined by one or more of the tuning control signals.

The switching unit operates (or is used) in an active configuration determined by the configuration instruction, the active configuration being one of a plurality of allowed configurations, the switching unit providing, in any one of the allowed configurations, for signals in the given frequency band and for any one of the array ports, a path between said any one of the array ports and one of the antenna ports. Thus, the switching unit operates in an active configuration which is one of the allowed configurations, and each allowed configuration corresponds to a selection of n antenna ports among the N antenna ports. It is also possible to say that the switching unit operates in an active configuration corresponding to a selection of n antenna ports among the N antenna ports.

Each allowed configuration corresponds to a selection of n antenna ports among the N antenna ports, the switching unit providing, for signals in the given frequency band and for any one of the array ports, a path between said any one of the array ports and one of the selected antenna ports. This path may preferably be a low loss path for signals in the given frequency band. The specialist understands that a suitable switching unit may comprise one or more electrically controlled switches and/or change-over switches (here, "electrically controlled" means "controlled by electrical means"). In this case, one or more of said electrically controlled switches and/or change-over switches may for instance be an electro-mechanical relay, or a microelectromechanical switch (MEMS switch), or a circuit using one or more PIN diodes and/or one or more insulated-gate field-effect transistors (MOSFETs) as switching devices.

For instance, the configuration instruction and/or the tuning instruction may be determined as a function of:
said q real quantities depending on the impedance matrix seen by the output ports of the power amplifiers;
one or more localization variables defined as in the eighth embodiment;
the frequencies used for radio communication with the antennas;
one or more additional variables, each of the additional variables lying in a set of additional variables, the elements of the set of additional variables comprising: communication type variables which indicate whether a radio communication session is a voice communication session, a data communication session or another type of communication session; a speakerphone mode activation indicator; a speaker activation indicator; variables obtained using one or more accelerometers; user identity variables which depend on the identity of the current user; reception quality variables; and emission quality variables.

The elements of said set of additional variables may further comprise one or more variables which are different from the localization variables and which characterize the grip with which a user is holding the transmitter for radio communication.

The configuration instruction and/or the tuning instruction may for instance be determined using a lookup table realized in the signal processing unit.

This tenth embodiment may possibly use some aspects of the technique disclosed in the French patent application No. 14/01221 of 28 May 2014, entitled "Communication radio utilisant une pluralité d'antennes sélectionnées", corresponding to the international application No. PCT/IB2015/052974 of 23 Apr. 2015, entitled "Radio communication using a plurality of selected antennas".

INDICATIONS ON INDUSTRIAL APPLICATIONS

The method and the apparatus of the invention are suitable for automatically tuning the impedance matrix seen by the radio-frequency signal input ports of a radio receiver using a plurality of antennas simultaneously, or seen by the radio-frequency signal output ports of a radio transmitter using a plurality of antennas simultaneously. In such applications, each target port of the apparatus of the invention may be coupled to an antenna, and each user port of the apparatus of the invention may be coupled to one of the radio-frequency signal input ports of the radio receiver using a plurality of antennas simultaneously, or to one of the radio-frequency signal output ports of the radio transmitter using a plurality of antennas simultaneously. Thus, the method and the apparatus of the invention are suitable for MIMO radio communication.

The radio transmitter of the invention is also suitable for MIMO radio communication.

The radio transmitter of the invention provides the best possible characteristics using very close antennas, hence presenting a strong interaction between the antennas. The invention is therefore particularly suitable for mobile radio transmitters and radio transceivers, for instance those used in portable radiotelephones or portable computers.

The radio transmitter of the invention provides the best possible characteristics using a very large number of antennas in a given volume, hence presenting a strong interaction between the antennas. The invention is therefore particularly suitable for high-performance radio transmitters and radio transceivers, for instance those used in the fixed stations of cellular radiotelephony networks.

A radio transmitter of the invention may be used in a device which also comprises a radio receiver having one or more parts in common with the radio transmitter of the invention. For instance, antennas and/or a multiple-input-port and multiple-output-port tuning unit used in a radio transmitter of the invention may also be parts of a radio receiver.

The invention claimed is:

1. A method for tuning an impedance matrix, at a predetermined given frequency, by m user ports of an apparatus comprising the m user ports and n target ports, where m is an integer greater than or equal to 2, and n is an integer greater than or equal to 2, the apparatus allowing, at the predetermined frequency, a transfer of power from the user ports to the target ports, the method comprising:

transmitting, by at least m sensors, at least one sensor output signal, each of the at least one sensor output signal being determined by at least one electrical variable;

estimating, by a signal processor, q real quantities depending on the impedance matrix presented by the user ports, where q is an integer greater than or equal to m, using the at least one sensor output signal obtained for m excitations applied to the user ports, at least one excitations being applied to each of the user ports, each of the excitations having a complex envelope, the complex envelopes of the excitations being linearly independent in a set of complex functions of one real variable, regarded as a vector space over a field of complex numbers, to transmit a tuning instruction as a function of the q real quantities depending on the impedance matrix; and receiving, by a tuning processor, the tuning instruction from the signal processor, and transmitting tuning control signals to a multiple-input-port and multiple-output-port tuning unit, the tuning control signals being determined as a function of the tuning instruction, reactance of each of p adjustable impedance devices being determined by at least one tuning control signal, wherein the multiple-input-port and multiple-output-port tuning unit comprising the p adjustable impedance devices, where p is an integer greater than or equal to m, at the predetermined frequency, each of the p adjustable impedance devices of the multiple-input-port and multiple-output-port tuning unit has a reactance, the reactance of any one of the p adjustable impedance devices having an influence on the impedance matrix, the reactance of any one of the p adjustable impedance devices being adjustable by electrical means.

2. The method of claim 1, wherein any diagonal entry of the impedance matrix is influenced by the reactance of at least one of the p adjustable impedance devices.

3. The method of claim 2, wherein the reactance of at least one of the p adjustable impedance devices of the multiple-input-port and multiple-output-port tuning unit has an influence on at least one non-diagonal entry of the impedance matrix.

4. The method of claim 1,
wherein n=m, and
wherein the multiple-input-port and multiple-output-port tuning unit is composed of n single-input-port and single-output-port tuning units each comprising one or more of the p adjustable impedance devices.

5. The method of claim 1, wherein two or more of the excitations are applied simultaneously.

6. An apparatus for tuning an impedance matrix, at a predetermined frequency, by m user ports of the apparatus comprising the m user ports and n target ports, where m is an integer greater than or equal to 2, and n is an integer greater than or equal to 2, the apparatus allowing, at the predetermined frequency, a transfer of power from the user ports to the target ports, the apparatus comprising:

at least m sensors configured to transmit at least one sensor output signal, each of the at least one sensor output signal being determined by one or more electrical variables;

a signal processor configured to estimate q real quantities depending on the impedance matrix presented by the user ports, where q is an integer greater than or equal to m, using the at least one sensor output signal obtained for m excitations applied to the user ports, at least one excitation being applied to each of the user ports, each of the excitations having a complex envelope, the complex envelopes of the excitations being linearly independent in a set of complex functions of one real variable, regarded as a vector space over a field of complex numbers, transmit a tuning instruction as a function of the q real quantities depending on the impedance matrix;

a multiple-input-port and multiple-output-port tuning unit comprising p adjustable impedance devices, where p is an integer greater than or equal to m, at the predetermined frequency, each of the p adjustable impedance devices of the tuning unit has a reactance, the reactance of any one of the adjustable impedance devices having an influence on the impedance matrix, the reactance of any one of the p adjustable impedance devices being adjustable by electrical means; and a tuning processor configured to receive the tuning instruction from the signal processor, and transmit tuning control signals to the multiple-input-port and multiple-output-port tuning unit, the tuning control signals being determined as a function of the tuning instruction, the reactance of each of the p adjustable impedance devices being determined by at least one tuning control signal.

7. The apparatus of claim 6, wherein the at least one sensors output signal comprises a first sensor output signal proportional to a first electrical variable, the first electrical variable being a voltage across one of the user ports and a second sensor output signal proportional to a second electrical variable, the second electrical variable being a current flowing in one of the user ports.

8. The apparatus of claim 6, wherein the at least one sensor output signal comprises a first sensor output signal proportional to a first electrical variable, the first electrical variable being an incident voltage at one of the user ports, and a second sensor output signal proportional to a second electrical variable, the second electrical variable being a reflected voltage at one of the user ports.

9. The apparatus of claim 6, wherein the tuning instruction indicates that the impedance matrix is equal to a wanted impedance matrix.

10. The apparatus of claim 6, wherein if an impedance matrix seen by the target ports is equal to a diagonal impedance matrix, the reactance of any one of the p adjustable impedance devices has an influence on the impedance matrix.

11. The apparatus of claim 6, wherein if an impedance matrix seen by the target ports is equal to the diagonal impedance matrix, the reactance of at least one of the p adjustable impedance devices has an influence on at least one non-diagonal entry of the impedance matrix.

12. The apparatus of claim 6,
wherein n=m, and
wherein the multiple-input-port and multiple-output-port tuning unit is composed of n single-input-port and single-output-port tuning units each comprising one or more of the p adjustable impedance devices.

13. The apparatus of claim 6, wherein two or more of the excitations are applied simultaneously.

14. A transmitter for radio communication with a plurality of antennas, comprising:
n antenna output ports, where n is an integer greater than or equal to 2;
m power amplifiers, where m is an integer greater than or equal to 2, each of the power amplifiers having an output port, each of the power amplifiers configured to transmit a power in a predetermined frequency band, a part of the power being transferred to the antenna output ports, the output ports of the power amplifiers seeing, at a frequency in the predetermined frequency band;
at least m sensors configured to transmit at least one sensor output signal, each of the at least one sensor output signal being determined by at least one electrical variable;
a signal processor configured to estimate q real quantities depending on the impedance matrix, where q is an integer greater than or equal to m, using the at least one sensor output signal obtained for m excitations applied by the power amplifiers at the output ports of the power amplifiers, at least one of the excitations being applied at each of the output ports of the power amplifiers, each of the excitations having a complex envelope, the complex envelopes of the m excitations being linearly independent in a set of complex functions of one real variable, regarded as a vector space over a field of complex numbers, the signal processor delivering a tuning instruction as a function of the q real quantities depending on the impedance matrix;
a multiple-input-port and multiple-output-port tuning unit comprising p adjustable impedance devices of the tuning unit, where p is an integer greater than or equal to m, at the frequency in the given frequency band, each of the p adjustable impedance devices of the tuning unit has a reactance, the reactance of any one of the p adjustable impedance devices having an influence on the impedance matrix seen by the output ports of the power amplifiers, the reactance of any one of the adjustable impedance devices being adjustable by electrical means; and
a tuning processor configured to receive the tuning instruction from the signal processor, and transmit tuning control signals to the multiple-input-port and multiple-output-port tuning unit, the tuning control signals being determined as a function of the tuning instruction, the reactance of each of the p adjustable impedance devices being determined by one or more of the tuning control signals.

15. The transmitter of claim 14, wherein the at least one sensor output signal comprises: a first sensor output signal proportional to a first electrical variable, the first electrical variable being a voltage across one of the output ports of the power amplifiers, and a second sensor output signal proportional to a second electrical variable, the second electrical variable being a current flowing in one of the output ports of the power amplifiers.

16. The transmitter of claim 14, wherein the at least one sensor output signal comprises a first sensor output signal proportional to a first electrical variable, the first electrical variable being an incident voltage at one of the output ports of the power amplifiers, and a second sensor output signal proportional to a second electrical variable, the second electrical variable being a reflected voltage at one of the output ports of the power amplifiers.

17. The transmitter of claim 14, wherein the tuning instruction indicates that the impedance matrix is substantially equal to a wanted impedance matrix.

18. The transmitter of claim 14, wherein any diagonal entry of the impedance matrix is influenced by the reactance of at least one of the p adjustable impedance devices.

19. The transmitter of claim 18, wherein the reactance of at least one of the adjustable impedance devices of the multiple-input-port and multiple-output-port tuning unit has an influence on at least one non-diagonal entry of the impedance matrix.

20. The transmitter of claim 14, wherein n=m, and wherein the multiple-input-port and multiple-output-port tuning unit is composed of n single-input-port and single-output-port tuning units each comprising one or more of the p adjustable impedance devices.

21. The transmitter of claim 14, wherein two or more of the excitations are applied simultaneously.

* * * * *